(12) United States Patent
Sasaki et al.

(10) Patent No.: US 9,401,419 B2
(45) Date of Patent: Jul. 26, 2016

(54) SPIN TRANSPORT DEVICE

(75) Inventors: Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 895 days.

(21) Appl. No.: 13/445,476

(22) Filed: Apr. 12, 2012

(65) Prior Publication Data

US 2012/0267734 A1 Oct. 25, 2012

(30) Foreign Application Priority Data

Apr. 21, 2011 (JP) .................. 2011-095423

(51) Int. Cl.
| | | |
|---|---|---|
| *H01L 29/88* | (2006.01) | |
| *H01L 27/108* | (2006.01) | |
| *H01L 29/66* | (2006.01) | |
| *H01L 29/82* | (2006.01) | |
| *H01L 29/06* | (2006.01) | |

(52) U.S. Cl.
CPC .......... *H01L 29/66984* (2013.01); *H01L 29/82* (2013.01); *H01L 29/0657* (2013.01)

(58) Field of Classification Search
USPC ........ 257/20, 414, 421–427, E29.323; 438/3; 360/324–326; 365/157–158, 171–173; 29/737
See application file for complete search history.

(56) References Cited

U.S. PATENT DOCUMENTS

| | | | | |
|---|---|---|---|---|
| 6,963,091 | B1* | 11/2005 | Vashchenko | .......... H01L 29/456 257/213 |
| 7,608,901 | B2* | 10/2009 | Koo | ....................... G11C 11/16 257/421 |
| 8,872,514 | B2* | 10/2014 | Sasaki | .................... B82Y 25/00 324/244 |
| 2010/0314702 | A1* | 12/2010 | Sasaki et al. | .................. 257/421 |
| 2015/0001601 | A1* | 1/2015 | Koike | ..................... H01L 43/02 257/295 |

FOREIGN PATENT DOCUMENTS

| | | |
|---|---|---|
| JP | A-2010-239011 | 10/2010 |
| JP | A-2010-287666 | 12/2010 |

* cited by examiner

*Primary Examiner* — Mark Tornow
*Assistant Examiner* — Priya Rampersaud
(74) *Attorney, Agent, or Firm* — Oliff PLC

(57) ABSTRACT

A spin transport device includes a semiconductor layer 3, a first ferromagnetic layer 1 provided on the semiconductor layer 3 via a first tunnel barrier layer 5A, and a second ferromagnetic layer 2 provided on the semiconductor layer 3 via a second tunnel barrier layer 5B to be spaced from the first ferromagnetic layer 1, and the semiconductor layer 3 includes a first region R1 broadening in a direction away from the first ferromagnetic layer 1 along a direction orthogonal to a thickness direction from the first ferromagnetic layer 1, and a second region R12 extending in a direction toward the second ferromagnetic layer 2 along the direction orthogonal to the thickness direction from the first ferromagnetic layer 1. The second region R12 has a relatively higher impurity concentration than the first region R1.

5 Claims, 26 Drawing Sheets

US 9,401,419 B2

SPIN TRANSPORT DEVICE

BACKGROUND OF THE INVENTION

1. Field of the Invention

The present invention relates to a spin transport device in semiconductor spintronics.

2. Related Background Art

In recent years, a phenomenon of spin transport in a semiconductor, particularly silicon (Si), has attracted much attention. Silicon is a key material in current semiconductor products. If silicon-based spintronics can be realized, new functions can be added to a silicon device without discarding existing technology. An example of such a semiconductor spin transport device includes a spin-MOSFET. Semiconductor spin transport devices include a semiconductor spin transport device using both electric current and spin current (magnetoresistance effect type) and a semiconductor spin transport device using only spin current (non-local structure type).

In the non-local structure type semiconductor spin transport device, since a path of the electric current differs from a path of the spin current, and the spin current does not have charge or cause a voltage, an output with high S/N is expected to be obtained. However, in the non-local structure type semiconductor spin transport device, there is a problem in that an output is generally small. In order to increase the output, the inventors of the present application have considered a method of adjusting an impurity concentration in a semiconductor (see Patent Document 1 (Japanese Patent Laid-Open No. 2010-287666)).

In this method, high concentration impurities are added only near a surface of the semiconductor to decrease interfacial resistance, resulting in an improved output.

SUMMARY OF THE INVENTION

However, in a non-local structure type spin transport device, additional improvement of an output is expected. An aspect of the present invention has been made in view of such a problem, and an object of the present invention is to provide a spin transport device capable of improving an output.

In order to resolve the above-described problem, a spin transport device according to an aspect of the present invention includes: a semiconductor layer; a first ferromagnetic layer provided on the semiconductor layer via a first tunnel barrier layer; and a second ferromagnetic layer provided on the semiconductor layer via a second tunnel barrier layer to be spaced from the first ferromagnetic layer, wherein the semiconductor layer includes: a first region broadening in a direction away from the first ferromagnetic layer along a direction orthogonal to a thickness direction from the first ferromagnetic layer; and a second region extending in a direction toward the second ferromagnetic layer along the direction orthogonal to the thickness direction from the first ferromagnetic layer, the second region having a relatively higher impurity concentration than the first region.

Spin injected from the first ferromagnetic layer into the semiconductor layer via the first tunnel barrier layer is diffused with a higher probability toward a region in which an impurity concentration is higher. That is, since the second region extends in a direction from the first ferromagnetic layer toward the second ferromagnetic layer, spin resistance of the semiconductor region in this direction decreases and a great amount of the spin current flows toward the second ferromagnetic layer. In this spin transport device, it is possible to improve the output generated by the spin current reaching the second ferromagnetic layer since the output depends on the magnitude of the spin current.

The second region includes regions in the semiconductor layer immediately below the first and second ferromagnetic layers.

In this case, since spin resistance decreases even in the regions immediately below the first and second ferromagnetic layers and it is easy for the spin current to flow, the spin current reaching the second ferromagnetic layer increases such that the output can be improved.

Further, the spin transport device according to an aspect of the present invention includes: a first reference electrode provided in a region outside a region between the first and second ferromagnetic layers on the semiconductor layer; a second reference electrode provided in the outside region on the semiconductor layer; an electron flow source connected between the first ferromagnetic layer and the first reference electrode; and a voltage detection circuit connected between the second ferromagnetic layer and the second reference electrode, wherein the first region is located between the first ferromagnetic layer and the first reference electrode.

In this case, if electrons are supplied from the electron flow source, the spin current is diffused from the semiconductor below the first tunnel barrier layer in the first ferromagnetic layer. The spin current flows toward the second ferromagnetic layer and a voltage is generated between the second ferromagnetic layer and the second reference electrode depending on an amount of the spin current. The voltage detection circuit can detect this voltage as an output of the spin transport device.

An impurity concentration in the first region is $1 \times 10^{13}/cm^3$ to less than $1 \times 10^{18}/cm^3$, and an impurity concentration in the second region is $1 \times 10^{18}/cm^3$ to $1 \times 10^{20}/cm^3$.

The impurity concentration in the second region is higher than that in the first region, but when the impurity concentrations are in the ranges described above, there is an effect that flow of the spin current toward the second region increases.

Each of the first and second tunnel barrier layers is formed of MgO, $Al_2O_3$, $SiO_2$, ZnO, or $MgAl_2O_4$. These materials have an advantage in that efficiency of spin injection and detection is high.

According to the spin transport device in an aspect of the present invention, it is possible to improve the output since the spin current can be unevenly distributed in the region in an output direction due to a difference in impurity concentration.

DESCRIPTION OF THE PREFERRED EMBODIMENTS

Figure 1:
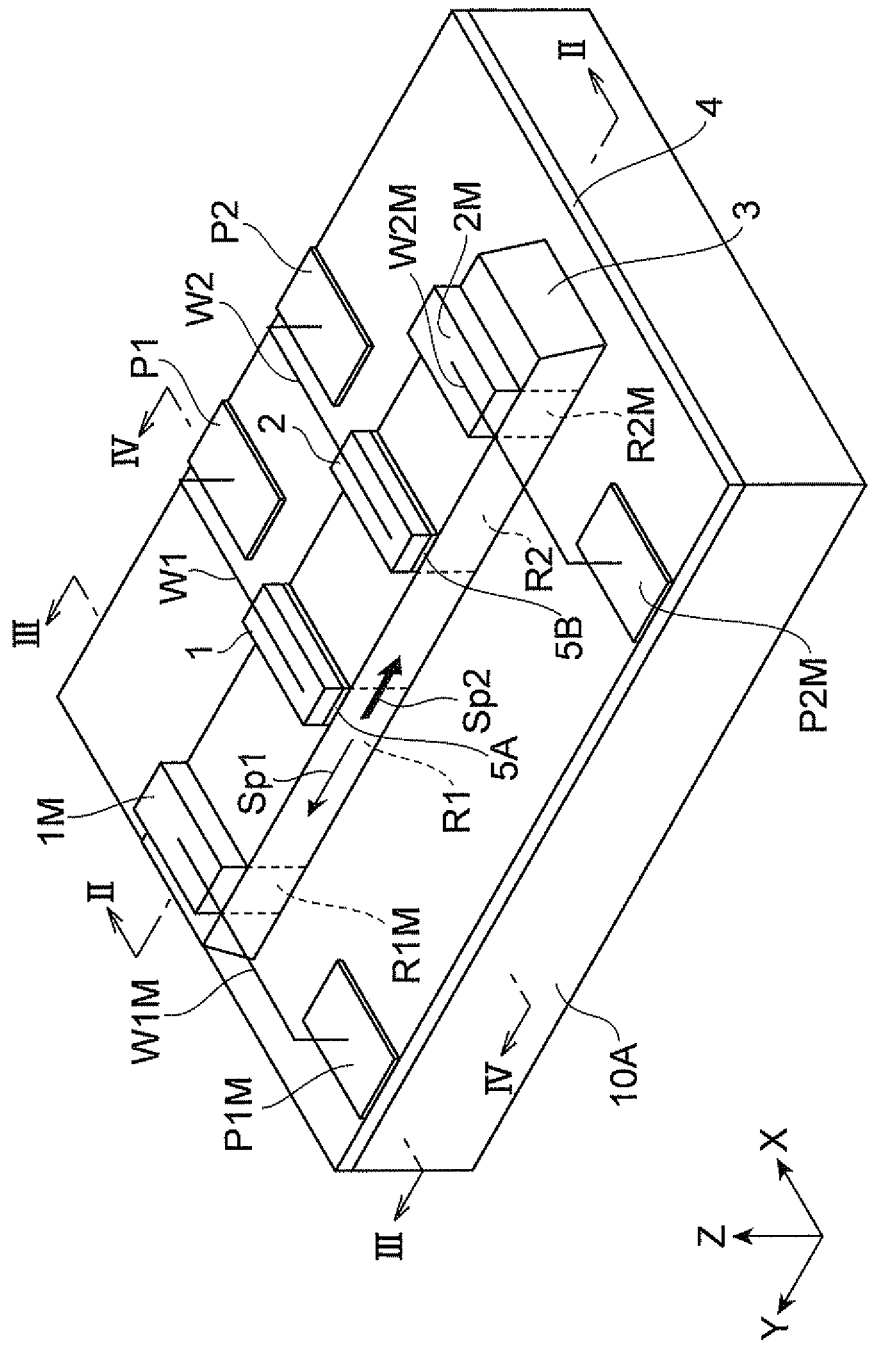
FIG. 1 is a perspective view of a spin transport device.

Hereinafter, a spin transport device according to embodiments will be described. The same reference numerals are given to the same elements, and duplicate explanation thereof will be omitted.

Figure 2:
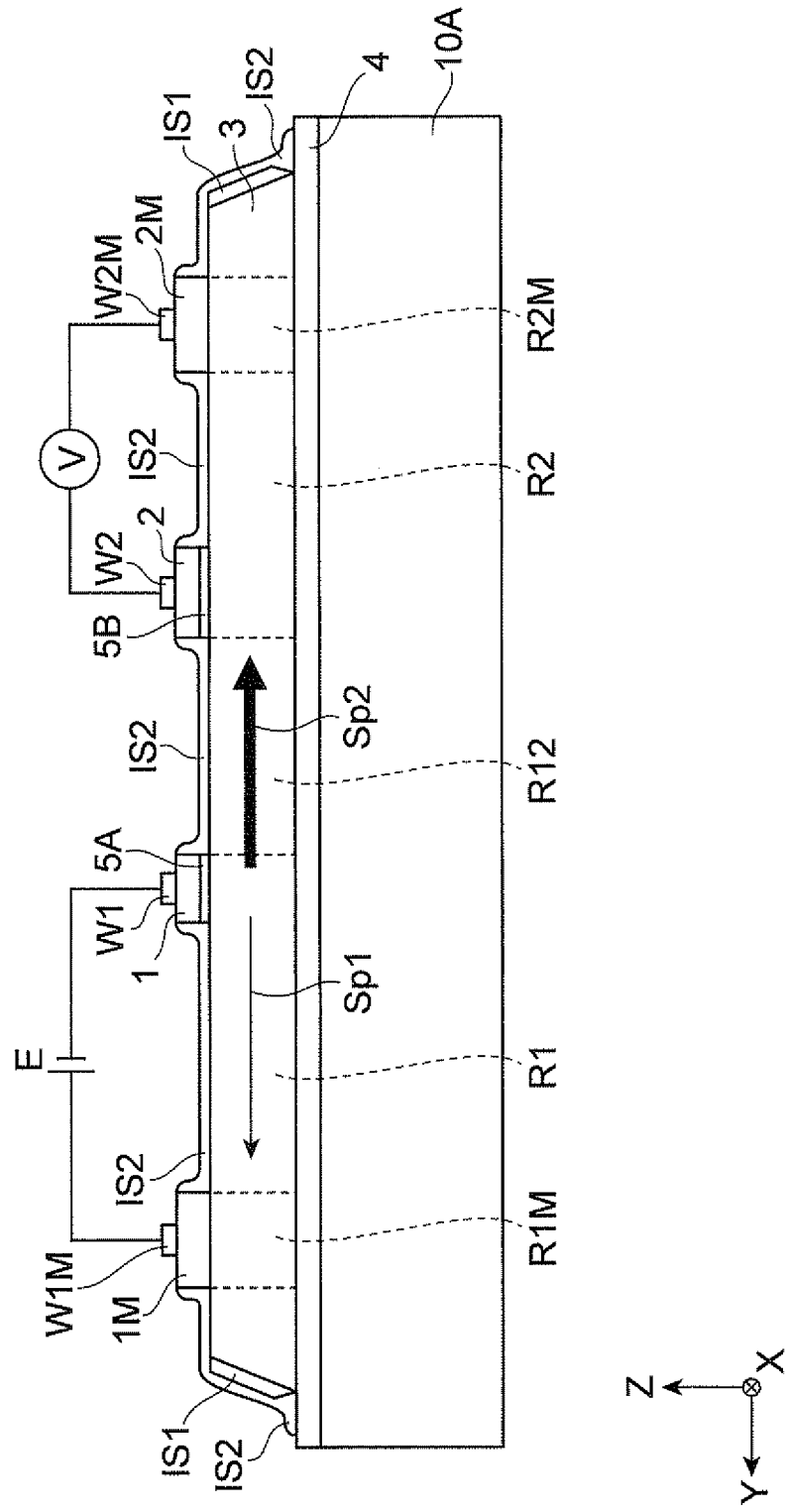
FIG. 2 is a view showing a cross-sectional configuration taken along arrow line II-II of the spin transport device shown in FIG. 1.

FIG. 1 is a perspective view of a spin transport device, and FIG. 2 is a view showing a cross-sectional configuration taken along arrow line II-II of the spin transport device shown in FIG. 1.

An insulating layer 4 (200 nm thick) is provided on a base substrate 10A. A semiconductor layer 3 having a rectangular parallelepiped or tetragonal frustum shape is provided on the insulating layer 4. A longitudinal direction of the semiconductor layer 3 is a Y axis direction in an XYZ three-dimensional Cartesian coordinate system, a transverse direction is an X axis direction, and a thickness direction is a Z axis direction. The semiconductor layer 3 functions as a channel through which spin is transported and diffused. A first ferromagnetic layer 1, a second ferromagnetic layer 2, a first reference electrode 1M, and a second reference electrode 2M are formed on the semiconductor layer 3. Wirings W1, W2, W1M and W2M are provided on the first ferromagnetic layer 1, the second ferromagnetic layer 2, the first reference electrode 1M, and the second reference electrode 2M, respectively.

Longitudinal directions of the first ferromagnetic layer 1 and the second ferromagnetic layer 2 are both the X axis direction, and magnetization directions thereof are both, for example, a positive direction of the X axis (parallel). It is understood that the magnetization directions of the first ferromagnetic layer 1 and the second ferromagnetic layer 2 may be set to reverse directions (antiparallel). In such a spin transport device, a magnetic field applied to spin current being propagated is indirectly detected as a voltage at an output side. Accordingly, the spin transport device may be preferably used as a magnetic sensor. Further, the magnetization directions of the first ferromagnetic layer 1 and the second ferromagnetic layer 2 may be changed arbitrarily using a torque effect of a magnetic field, domain wall motion, or spin current. This enables the spin transport device to have a memory or calculation function.

Electrode pads P1, P2, P1M and P2M are provided on the insulating layer 4. The wirings W1, W2, W1M and W2M are electrically connected to the respective electrode pads P1, P2, P1M and P2M.

An electron flow source E is connected between the electrode pad P1 and the electrode pad P1M (see FIG. 2), and a bias voltage is applied between the wiring W1 and the wiring W1M. Accordingly, electrons are injected from the electron flow source E into the first ferromagnetic layer 1, and electrons transmitted through a first tunnel barrier layer 5A located beneath the first ferromagnetic layer 1 are introduced into the semiconductor layer 3. In this case, the electrons have polarized spin that depends on the magnetization direction in the first ferromagnetic layer 1. According to an internal electric field formed inside the semiconductor layer 3, the injected electrons flow from the first ferromagnetic layer 1 into the first reference electrode 1M through the inside of the semiconductor layer 3.

Meanwhile, the spin is also diffused from a region in the semiconductor layer 3 immediately below the first ferromagnetic layer 1. A diffusion direction of the spin depends on spin resistance $R_N$ in the semiconductor layer 3. The spin is diffused both in a positive Y direction toward the first reference electrode 1M (indicated by an arrow Sp1) and in a negative Y direction toward the second ferromagnetic layer 2 (indicated by an arrow Sp2). If a spin current having a certain spin direction is diffused in a direction of the second ferromagnetic layer 2, a voltage is generated between the second ferromagnetic layer 2 and the second reference electrode 2M. A second tunnel barrier layer 5B is interposed between the second ferromagnetic layer 2 and the semiconductor layer 3 such that the spin current is not directly absorbed by the second ferromagnetic layer 2. When the direction of the spin rotates under the influence of an external magnetic field during the diffusion of the spin, a detected voltage is changed depending on a degree of coincidence between the direction of the spin and the magnetization direction of the second ferromagnetic layer 2.

A voltage detection circuit V is connected between the electrode pad P2 and the electrode pad P2M (see FIG. 2). A voltage between the wirings W2 and W2M, that is, a voltage between the second ferromagnetic layer 2 and the second reference electrode 2M, is detected by the voltage detection circuit V.

Here, impurities (a dopant) are added to the semiconductor layer 3 asymmetrically with respect to an XZ plane passing the first ferromagnetic layer 1. That is, the semiconductor layer 3 includes a first region R1 broadening in a direction away from the first ferromagnetic layer 1 along a direction orthogonal to a thickness direction from the first ferromagnetic layer 1, and a second region R12 extending toward the second ferromagnetic layer 2 along the direction orthogonal to the thickness direction from the first ferromagnetic layer 1. The second region R12 has a relatively higher impurity concentration than the first region R1. Because the impurity concentration in the second region R12 is relatively higher, the spin resistance $R_N$ decreases and a large percentage of the diffusing spin current flows through the second region R12.

Further, the spin resistance $R_N$ is given by the following equation:

$$R_N = (P^2 \lambda_{N\rho})/A$$

P denotes injection and detection efficiency of the spin, $\lambda_N$ denotes a spin diffusion length in the semiconductor, p denotes electrical resistivity of the semiconductor through which the spin current flows, and A denotes a semiconductor cross-sectional area orthogonal to a flow direction of the spin current. If the impurity concentration increases, p decreases. Accordingly, $R_N$ decreases.

The spin injected from the first ferromagnetic layer 1 into the semiconductor layer 3 via the first tunnel barrier layer 5A is diffused with a higher probability toward a region in which an impurity concentration is higher. That is, since the second region R12 extends in a direction from the first ferromagnetic layer 1 toward the second ferromagnetic layer 2, the spin resistance $R_N$ of the semiconductor region in this direction decreases and a great amount of the spin current flows in the direction of the second ferromagnetic layer 2. In this spin transport device, it is possible to improve the output generated by the spin current reaching the second ferromagnetic layer 2 since the output depends on the magnitude of the spin current.

The first region R1 shown in FIGS. 1 and 2 is a part of the semiconductor layer 3 before impurities are added. With respect to the Y axis direction among in-plane directions, the first region R1 broadens in the positive Y direction from an edge of the first ferromagnetic layer 1 at a side of the second ferromagnetic layer 2 to an edge of the first reference electrode 1M. With respect to a width direction, the first region R1 broadens to include dimensions in the width direction (X axis direction) of the first ferromagnetic layer 1 and the first reference electrode 1M. Further, with respect to the thickness direction, the first region R1 broadens until reaching the insulating layer 4.

The second region R12 broadens toward the side opposite to the first region R1. With respect to the Y axis direction among in-plane directions, the second region R12 shown in FIGS. 1 and 2 broadens from an edge of the first ferromagnetic layer 1 at the side of the second ferromagnetic layer 2 to an edge of the second ferromagnetic layer 2. With respect to the width direction, the second region R12 broadens to include dimensions in the width direction (X axis direction) of the first and second ferromagnetic layers 1 and 2. Further, with respect to the thickness direction, the second region R12 broadens until reaching the insulating layer 4.

Further, although the asymmetric impurity distribution is sufficient when there are the first and second regions R1 and R12, in an embodiment, there is another impurity distribution.

A semiconductor region R2 broadening toward the second reference electrode 2M relative to the second region R12 is a part of the semiconductor layer 3 before addition of impurities, and has a low impurity concentration, similar to the first region R1. With respect to the Y axis direction among in-plane directions, the semiconductor region R2 shown in FIGS. 1 and 2 broadens in a negative Y direction from the edge of the second ferromagnetic layer 2 at a side of the first ferromagnetic layer 1 to an edge of the second reference electrode 2M. With respect to the width direction, the semiconductor region R2 broadens to include dimensions in the width direction (X axis direction) of the second ferromagnetic layer 2 and the second reference electrode 2M. Further, with respect to the thickness directions, the semiconductor region R2 broadens until reaching the insulating layer 4.

In an embodiment, impurities are also added to regions immediately below the first reference electrode 1M and the second reference electrode 2M, similar to the second region R12, resulting in semiconductor regions R1M and R2M. The semiconductor regions R1M and R2M shown in FIGS. 1 and 2 are located in the regions immediately below the first reference electrode 1M and the second reference electrode 2M, respectively, in the in-plane directions. Further, with respect to the thickness direction, the semiconductor regions R1M and R2M broaden until reaching the insulating layer 4.

When the impurity concentration is relatively high in the regions R1M and R2M immediately below the electrodes, electric resistance is relatively small in these regions. In this case, it is easy for the semiconductor layer 3 and the reference electrodes 1M and 2M to be electrically matched.

All of the above-described regions in the semiconductor layer 3 have the same conductivity type. When the semiconductor layer 3 is a P type, impurities include B, Al, Ga, In and the like. When the semiconductor layer 3 is an N type, impurities include P, As, Sb and the like.

A first insulating film (oxide film: $SiO_2$) IS1 is formed on an exposed side surface of the semiconductor layer 3 to protect the side surface. Further, a second insulating film (oxide film: $SiO_2$) IS2 is formed as a protection film on the first insulating film IS1 and an exposed surface of the semiconductor layer 3.

Figure 3:
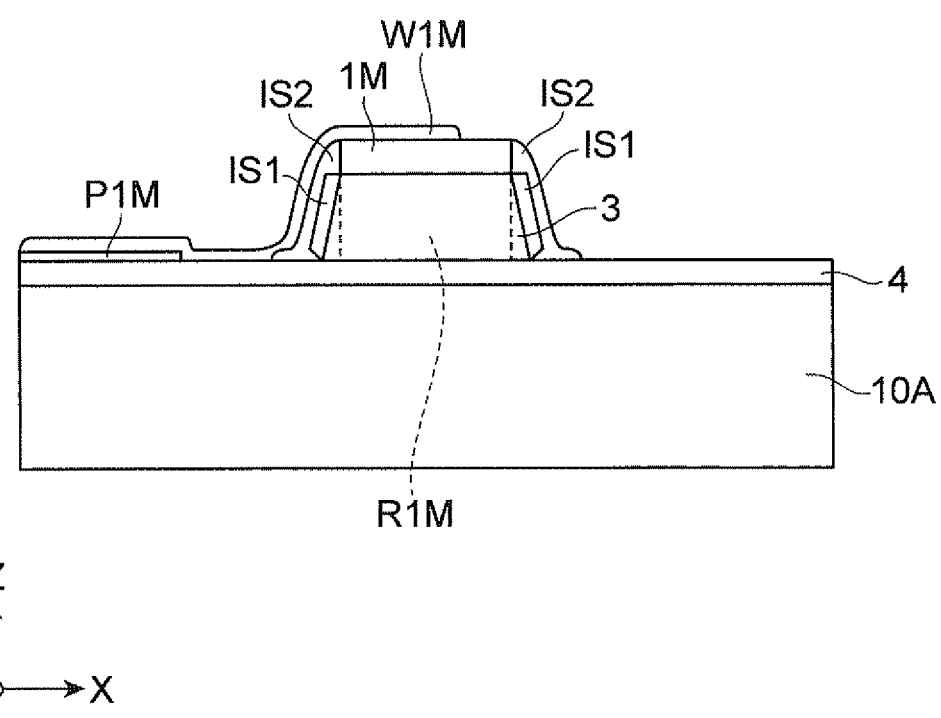
FIG. 3 is a view showing a cross-sectional configuration taken along arrow line III-III of the spin transport device shown in FIG. 1.

FIG. 3 is a view showing a cross-sectional configuration of the spin transport device shown in FIG. 1 taken along arrow line III-III. This cross-section is an XZ cross-section through the reference electrode. A semiconductor region R1M to which impurities have been added exists in a region immediately below the first reference electrode 1M. Further, the wiring W1M is in contact with and electrically connected to the electrode 1M, and extends to the electrode pad P1M while crawling on the second insulating film IS2. The second insulating film IS2 prevents unnecessary contact between the wiring W1M passing the second insulating film IS2 and the semiconductor layer 3.

FIG. 3 shows the cross-sectional structure through the first reference electrode 1M, but a cross-sectional structure through the second reference electrode 2M is the same as the cross-sectional structure through the first reference electrode 1M.

That is, the semiconductor region R2M to which impurities have been added is present in a region immediately below the second reference electrode 2M, and the wiring W2M is in contact with and electrically connected to the electrode 2M and extends to the electrode pad P2M while crawling on the second insulating film IS2. The second insulating film IS2 prevents unnecessary contact between the wiring W2M passing the second insulating film IS2 and the semiconductor layer 3.

Figure 4:
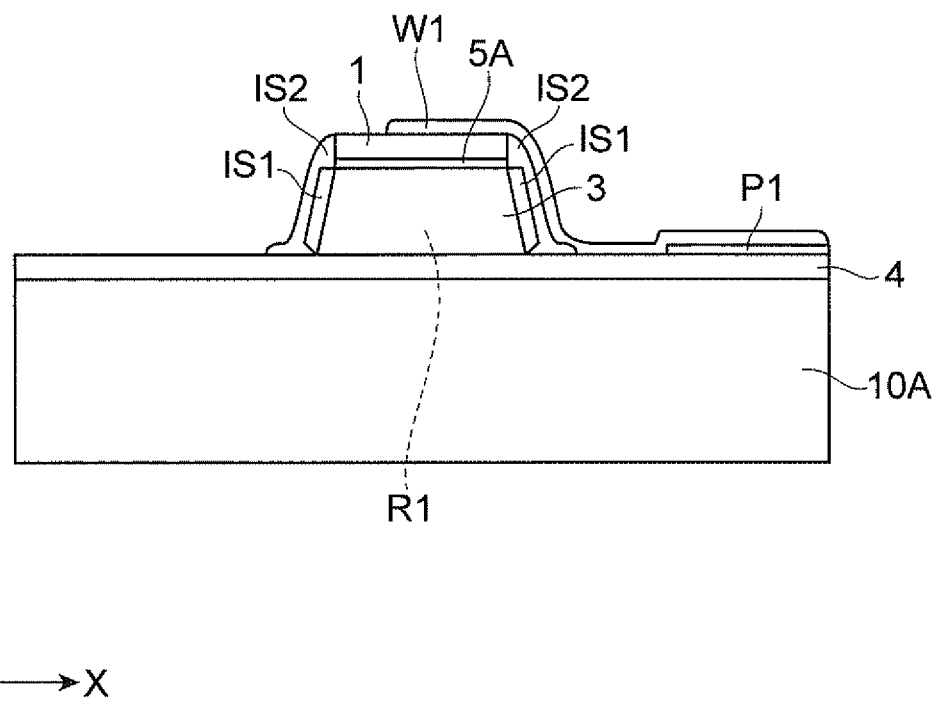
FIG. 4 is a view showing a cross-sectional configuration taken along arrow line IV-IV of the spin transport device shown in FIG. 1.

FIG. 4 is a view showing a cross-sectional configuration of the spin transport device shown in FIG. 1 taken along arrow line IV-IV.

This cross-section is an XZ cross-section through the ferromagnetic layer. A semiconductor region R1 to which impurities have not been added is present in a region immediately below the first ferromagnetic layer 1. Further, the wiring W1 is in contact with and electrically connected to the first ferromagnetic layer 1 and extends to the electrode pad P1 while crawling on the second insulating film IS2. The second insulating film IS2 prevents unnecessary contact between the wiring W1 passing the second insulating film IS2 and the semiconductor layer 3.

FIG. 4 shows the cross-sectional structure through the first ferromagnetic layer 1, but a cross-sectional structure through the second ferromagnetic layer 2 is the same as the cross-sectional structure through the first ferromagnetic layer 1.

That is, a semiconductor region R2 to which impurities have not been added is present in a region immediately below the second ferromagnetic layer 2. Further, the wiring W2 is in contact with and electrically connected to the second ferromagnetic layer 2, and extends to the electrode pad P2 while crawling on the second insulating film IS2. The second insulating film IS2 prevents unnecessary contact between the wiring W2 passing the second insulating film IS2 and the semiconductor layer 3.

Here, it is preferable that an impurity concentration in the first region R1 be $1 \times 10^{13}/cm^3$ to less than $1 \times 10^{18}/cm^3$, and an impurity concentration in the second region R12 be $1 \times 10^{18}/cm^3$ to $1 \times 10^{20}/cm^3$, in the case of P. A condition of the impurity concentration is determined depending on each type of impurity. The impurity concentration in the second region R12 is higher than that in the first region R1, but when the impurity concentrations are in the ranges described above, an influence of a Schottky barrier of the semiconductor is less. Accordingly, there are advantages in that resistance is small and a high output is obtained. Further, there is an effect that flow of the spin current toward the second region increases.

A direction of the spin present between the first ferromagnetic layer 1 and the second ferromagnetic layer 2 rotates under the influence of a magnetic field B introduced to the semiconductor layer 3, and a voltage output at the second ferromagnetic layer 2 is changed. Schemes of detecting the output at the second ferromagnetic layer 2 include (1) a magnetoresistance effect measurement scheme and (2) a spin current scheme. The above-described scheme is the spin current scheme (2), but the magnetoresistance effect measurement scheme may also be employed.

(1) In the case of the magnetoresistance effect measurement scheme, the first electrode 1M and the second electrode 2M are not used.

That is, formation of the electrodes is omitted, or even when the electrodes have been formed, the electrodes are not used. In this case, an electron flow source is connected between the first ferromagnetic layer 1 and the second ferromagnetic layer 2 to supply an electron flow therebetween. A polarization direction of spin of the injected electrons rotates depending on a direction of the magnetic field B introduced into the inside of the semiconductor layer 3 via a protrusion 3B of the semiconductor layer 3. Accordingly, since an amount of electrons reaching the second ferromagnetic layer 2 from the first ferromagnetic layer 1, in other words, polarizability, is changed, magnetoresistance of a region including a semiconductor crystal layer therebetween is changed. Accordingly, it is possible to measure the magnitude of the magnetic field B introduced into the semiconductor layer 3 by measuring the voltage between the first ferromagnetic layer 1 and the second ferromagnetic layer 2 using a voltage measuring circuit.

Further, in order to further improve an information reading speed, the spin current scheme is used as shown in FIGS. 1 to 10 described above.

(2) In the spin current scheme, the first electrode 1M and the second electrode 2M are used, the electron flow source E is connected between the first ferromagnetic layer 1 and the first electrode 1M, and the voltage detection circuit (means) V is connected between the second ferromagnetic layer 2 and the second electrode 2M, as shown in FIGS. 1 to 10.

The electron flow from the electron flow source E is supplied between the first ferromagnetic layer 1 and the first electrode 1M. In this case, spin currents Sp1 and Sp2 are diffused from the semiconductor layer 3 immediately below the first ferromagnetic layer 1. The spin current Sp2 propagates through the semiconductor layer 3 as a channel layer and reaches the second ferromagnetic layer 2. The direction of the spin rotates according to the magnetic field B applied to the spin in the course of propagating the spin current Sp2 and a voltage between the second ferromagnetic layer 2 and the second electrode 2M is changed. This voltage is measured by the voltage measuring circuit V. Thus, it is possible to measure the magnitude of the magnetic field B introduced into the semiconductor layer 3.

Next, detailed structures around the first and second ferromagnetic layers 1 and 2 and materials of respective components will be described.

Figure 26A:
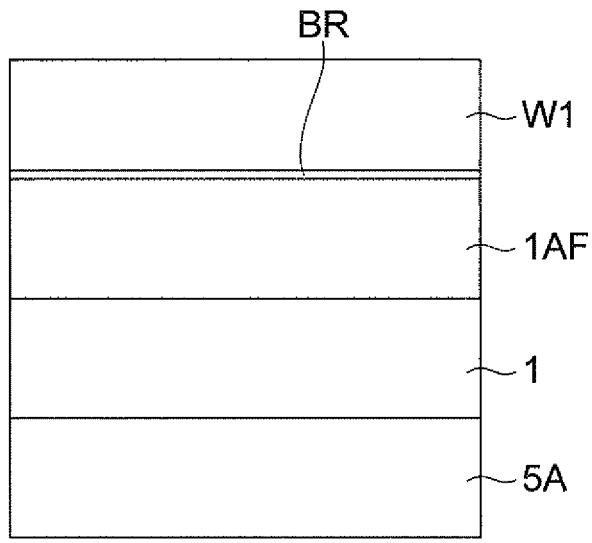
FIGS. 26A and 26B are views showing a detailed cross-sectional structure around a ferromagnetic layer.
Figure 26B:
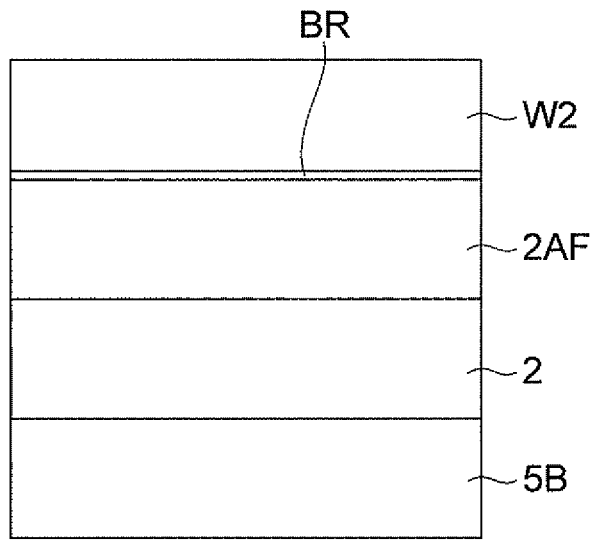

FIGS. 26A and 26B are views showing detailed cross-sectional structures around the ferromagnetic layers.

When a magnetization direction is fixed, the first ferromagnetic layer 1, a first antiferromagnetic layer 1AF, and the first wiring W1 are sequentially stacked on the first tunnel barrier layer 5A, as shown in FIG. 26A. Similarly, when the magnetization direction is fixed, the second ferromagnetic layer 2, a second antiferromagnetic layer 2AF, and the wiring layer W2 are sequentially stacked on the second tunnel barrier layer 5B, as shown in FIG. 26B. The magnetization direction is fixed by exchange-coupling of the ferromagnetic layer 1 or 2 and the antiferromagnetic layer 1AF or 2AF. When either of the ferromagnetic layers functions as a magnetization free layer, the antiferromagnetic layer is not used and an aspect ratio of the ferromagnetic layer decreases to suppress a tendency of the magnetization direction toward the longitudinal direction, such that the magnetization direction can easily rotate according to an external magnetic field.

A Schottky barrier formed upon Schottky contact between a metal and a semiconductor may be used as the first and second tunnel barrier layers 5A and 5B. However, from the viewpoint of controllability, it is preferable to use a tunnel insulating layer having a thickness of 2 nm or less. In this case, $Al_2O_3$, $SiO_2$, ZnO, $MgAl_2O_4$ or the like, as well as crystalline (single crystalline or polycrystalline, rather than amorphous) MgO, may be used as materials of the first and second tunnel barrier layers 5A and 5B. It is preferable that the thicknesses of the first and second tunnel barrier layers 5A and 5B be set to 2 nm or less for tunneling of electrons. There is an advantage that efficiency of spin injection and detection is high when such materials are used.

A material of each of the first ferromagnetic layer 1 and the second ferromagnetic layer 2 is a metal selected from the group consisting of Cr, Mn, Co, Fe and Ni, an alloy containing one or more elements of the group, or a compound containing one or more elements selected from the group and one or more elements selected from the group consisting of B, C, N, Si and Ge. For example, each of the first and second ferromagnetic layers 1 and 2 is formed of CoFe or NiFe. Since the materials are ferromagnetic materials having high spin polarizability, it is possible to suitably realize a function as a spin injection electrode or a spin receiving electrode.

As a material of each of the antiferromagnetic layers 1AF and 2AF, an Mn alloy such as IrMn or PtMn may be used. Further, when the magnetization direction is fixed using shape magnetic anisotropy, the antiferromagnetic layers 1AF and 2AF may be omitted.

Materials of the electrodes or the wiring layers W1, W2, W1M and W2M may be non-magnetic metals, but Al, Cu, Au or the like may be used.

A material of the semiconductor layer 3 is preferably Si having few crystal defects as described above. However, a compound semiconductor such as GaAs, AlGaAs, ZnO, diamond (C) or SiC, as well as a semiconductor such as Ge, may be employed. The semiconductor layer 3 is preferably formed of Si, Ge or GaAs among the above materials, since such materials are known to provide high-quality single domain crystals. Since the semiconductor has a relatively great spin diffusion length, it is possible to suitably accumulate spin in the channel.

The base substrate 10A is formed of a material that has high insulation, for example, a semiconductor such as AlTiC, $Al_2O_3$ or Si.

$SiO_2$, SiNx, MgO, $Al_2O_3$ or the like may be used as a material of the insulating film 4, which is, however, not particularly limited as long as it is an insulating film.

As described above, the spin transport device according to the above embodiment includes the semiconductor layer 3, the first ferromagnetic layer 1 provided on the semiconductor layer 3 via the first tunnel barrier layer 5A, and the second ferromagnetic layer 2 provided on the semiconductor layer 3 via the second tunnel barrier layer 5B to be spaced from the first ferromagnetic layer 1. Furthermore, when only the spin current is used for detection, the spin transport device includes the first reference electrode 1M provided in a region outside the region between the first and second ferromagnetic layers 1 and 2 on the semiconductor layer 3, the second reference electrode 2M provided in the outside region on the semiconductor layer 3, the electron flow source E connected between the first ferromagnetic layer 1 and the first reference electrode 1M, and the voltage detection circuit V connected between the second ferromagnetic layer 2 and the second reference electrode 2M, wherein the first region R1 is located between the first ferromagnetic layer 1 and the first reference electrode 1M.

In this case, if the electrons are supplied from the electron flow source E, spin current is diffused from the semiconductor beneath the first tunnel barrier layer 5A in the first ferromagnetic layer 1. The spin current flows toward the second ferromagnetic layer 2 and a voltage is generated between the second ferromagnetic layer 2 and the second reference electrode 2M depending on an amount of the spin current. The voltage detection circuit V can detect this voltage as an output of the spin transport device.

A method of fabricating the spin transport device will be described. First, an SOI substrate is prepared in which the insulating layer 4 and the semiconductor layer 3 are stacked on the base substrate 10A. The semiconductor layer 3 is formed of Si. Next, an alignment mark is formed on the SOT substrate using a photolithography process. A mask ($SiO_2$) having openings corresponding to the regions (R1M, R12, and R2M) to which impurities are to be added is then patterned on the semiconductor layer 3, and impurities are added into the semiconductor layer 3 through the mask. A diffusion method or an ion implantation method may be used for the addition.

After the impurities are added, heat treatment (annealing) is performed to activate the impurities and diffuse the impurities in the semiconductor layer 3. An annealing temperature may be 900° C. An impurity concentration in the first region R1 to which impurities have not been added is $1\times10^{13}/cm^3$ to less than $1\times10^{18}/cm^3$, and impurity concentrations in the second region R12 and the semiconductor regions R1M and R2M to which the impurities have been added are $1\times10^{18}/cm^3$ to $1\times10^{20}/cm^3$.

After the impurities have been added, the mask is removed using an HF solution and the surface of the semiconductor layer 3 is cleaned. That is, attached matters, organic matters, and an oxide film on the surface of the semiconductor layer 3 are removed. Cleaning using an organic solvent such as acetone, RCA cleaning, or application of the HF solution may be used. In the RCA cleaning, a hydrofluoric acid solution (HF) is brought into contact with the exposed surface, ammonia ($NH_4OH$) plus hydrogen peroxide ($H_2O_2$) is brought into contact with the exposed surface, hydrochloric acid (HCl) plus hydrogen peroxide ($H_2O_2$) is brought into contact with the exposed surface, and then cleaning is finally performed with pure water.

In fabrication, the respective layers on the semiconductor layer 3 are sequentially formed after the addition of impurities. An initial insulating layer, which is a source of the insulating layers 5A and 5B, is formed on the semiconductor layer 3 and then a ferromagnetic layer is formed on the initial insulating layer. An antiferromagnetic layer or a barrier layer is formed on the ferromagnetic layer, if necessary. An MBE method may be used to form the layers. For example, an MgO layer, an Fe layer, a Ti layer, and a Ta layer are sequentially formed on the semiconductor layer 3. Then, cleaning of the substrate (wafer) is carried out.

In addition, for a planar shape of the semiconductor layer 3 to be a rectangle, a rectangular mask is formed on the semiconductor layer 3 using photolithography, and Si around the semiconductor layer 3, which will become the rectangle, is wet-etched and removed using an HF solution. Prior to removal of Si around the semiconductor layer 3, each layer on the semiconductor layer 3 may be removed using dry etching, such as ion milling or RIE. An exposed side surface of the shaped semiconductor layer 3 is then oxidized to form an oxide film on the side surface of the semiconductor layer 3. The oxide film is used as an insulating layer IS1.

Next, a mask is formed on the exposed ferromagnetic layer (barrier layer) through photolithography. This mask has a shape having openings corresponding to regions in which the ferromagnetic layers 1 and 2 are to be formed. Using the mask, the ferromagnetic layer is removed using dry etching, such as milling or reactive ion etching, or wet etching, leaving the ferromagnetic layers 1 and 2. In this case, the etching is performed at least until the initial insulating layer is exposed. However, the etching may be performed until the semiconductor layer 3 is exposed.

Further, a mask having openings corresponding to regions in which electrodes are to be formed is formed on the semiconductor layer 3 by photolithography, the reference electrodes 1M and 2M are formed in the opening using, for example, a sputtering method, and then the mask is removed. When the initial insulating layer is present in the region in which the electrodes are to be formed, the initial insulating layer in such a region is removed using patterning by photolithography such that the reference electrodes 1M and 2M are in contact with the semiconductor layer 3. Next, the insulating layer IS2 is also formed on the exposed surface of the semiconductor layer 3 and side surfaces of the ferromagnetic layers 1 and 2.

Electrode pads P1, P2, P1M and P2M are formed on the insulating layer 4 using a sputtering method or an evaporation method. In addition, wirings W1, W2, W1M and W2M are formed using the sputtering method or the evaporation method, and the electrode pads P1, P2, P1M and P2M and the respective layers 1, 2, 1M and 2M are electrically connected by the wirings W1, W2, W1M and W2M. Thus, the spin transport device is completed. The regions to which impurities are added in the spin transport device can be changed by modifying the shape of the mask when the impurities are added, and a magnetic shield can be formed around the spin transport device, if necessary. For example, a sputtering method may be used to form the magnetic shield.

Next, an example in which only an impurity concentration distribution is changed in the above spin transport device will be described with reference to FIGS. 5 to 8.

Figure 5:
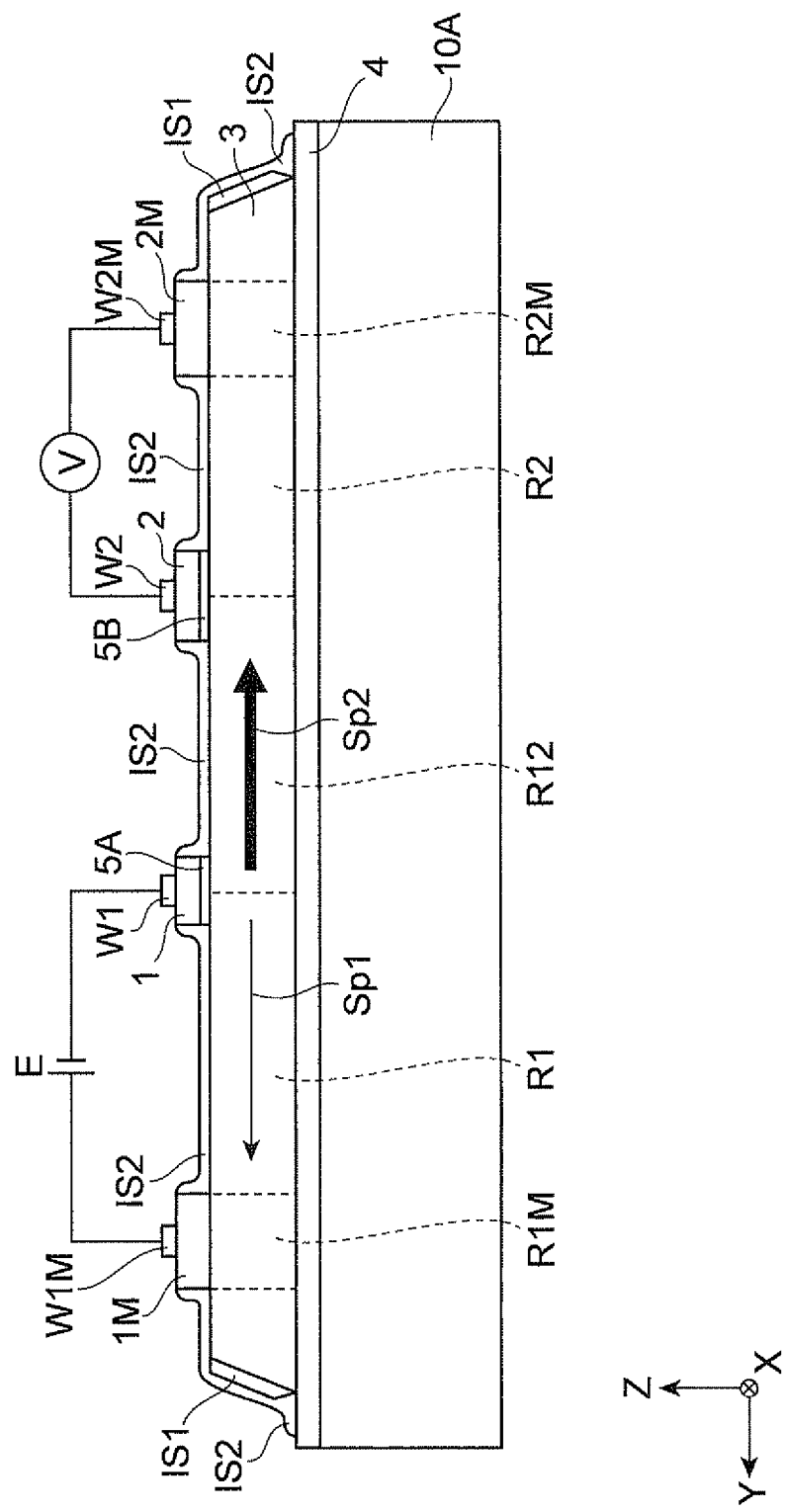
FIG. 5 is a view showing a cross-sectional configuration of a spin transport device having a different impurity concentration distribution from that in FIG. 2.

FIG. 5 is a view showing a cross-sectional configuration of a spin transport device having a different impurity concentration distribution from that in FIG. 2. This impurity concentration distribution is a distribution as a result of diffusing internal impurities in the semiconductor layer 3 through heat treatment in the spin transport device shown in FIG. 2. An impurity distribution region broadens along a Y axis direction.

The second region R12 described above broadens in the Y axis direction to overlap the regions immediately below the first and second ferromagnetic layers 1 and 2. Further, impurities of the original semiconductor regions R1M and R2M immediately below the electrodes are slightly diffused in the Y axis direction and dimensions in the Y axis direction of impurity concentration distributions of the semiconductor regions R1M and R2M broaden. The impurity concentration distributions of the semiconductor regions R1M and R2M may not broaden greatly.

That is, the second region R12 includes parts of the regions in the semiconductor layer 3 immediately below the first and second ferromagnetic layers 1 and 2. In this case, spin resistance decreases even in the regions immediately below the layers such that it is easy for spin current to flow. Accordingly, the spin current Sp2 reaching the second ferromagnetic layer 2 increases such that the output can be improved.

Figure 6:
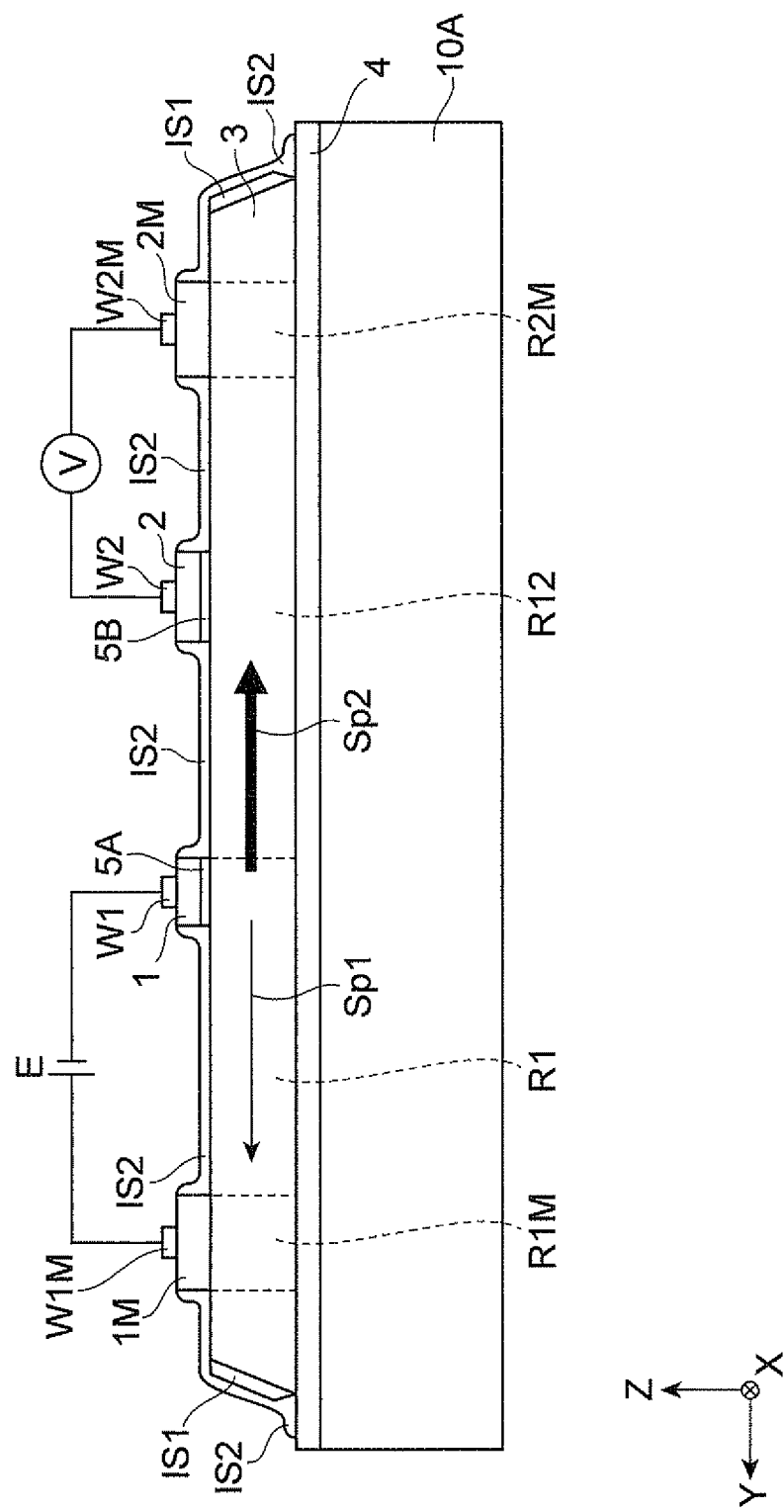
FIG. 6 is a view showing a cross-sectional configuration of a spin transport device having another different impurity concentration distribution.

FIG. 6 is a view showing a cross-sectional configuration of a spin transport device having another different impurity concentration distribution.

In the present example, a second region R12 extends to a semiconductor region R2M at a side of a second reference electrode, unlike the example shown in FIG. 2. Even in this case, since an impurity concentration of the second region R12 from a first ferromagnetic layer 1 to a second ferromagnetic layer 2 is higher than the impurity concentration of the first region R1, spin current Sp2 flowing toward the second ferromagnetic layer 2 is more than electric current flowing toward a first reference electrode 1M. Further, when the second region R12 broadens as described above, there is an effect that a voltage noise is small.

Figure 7:
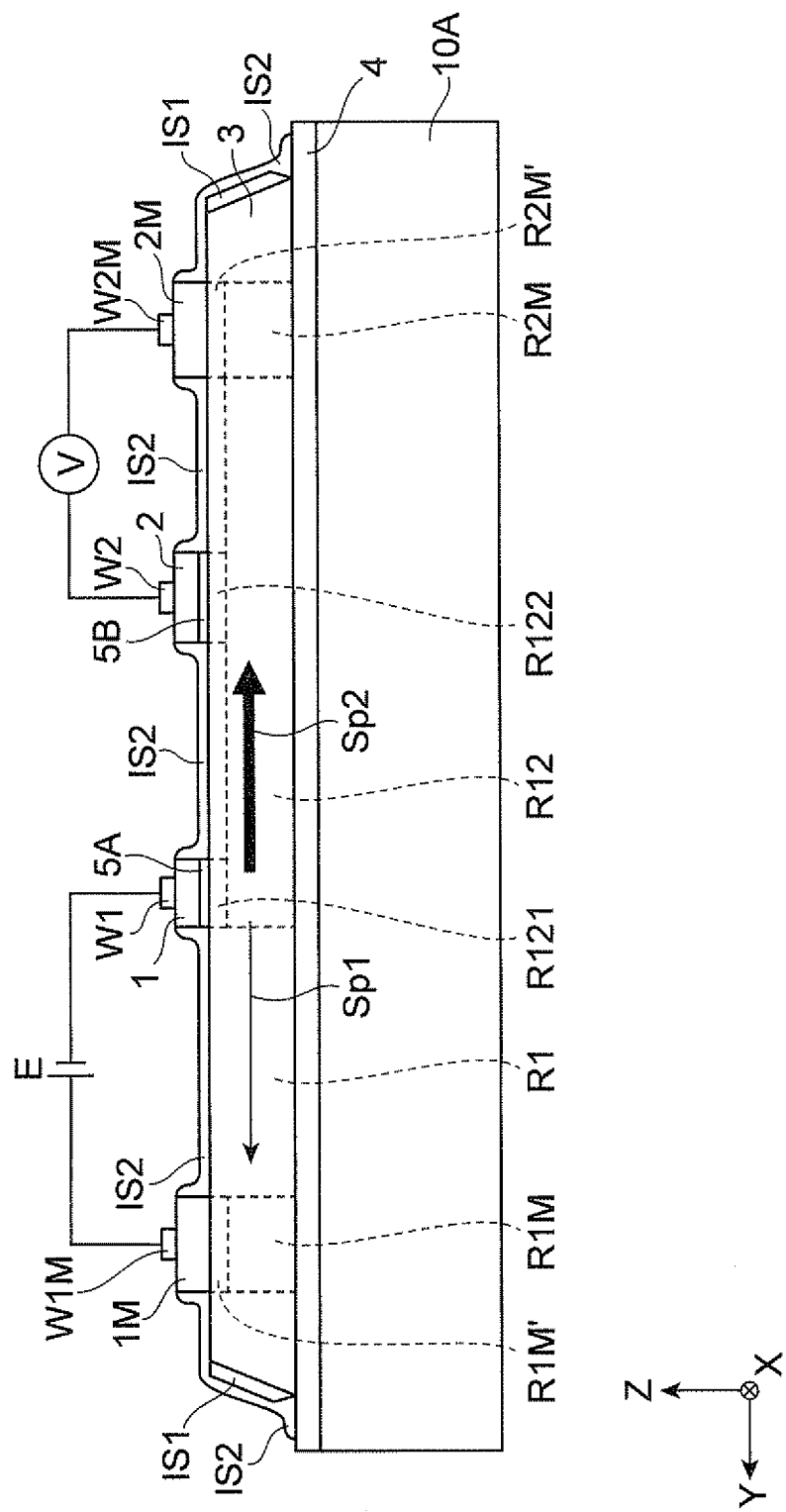
FIG. 7 is a view showing a cross-sectional configuration of a spin transport device having another different impurity concentration distribution.

FIG. 7 is a view showing a cross-sectional configuration of a spin transport device having another different impurity concentration distribution.

In the present example, impurities are added immediately below respective electrodes (a first ferromagnetic layer 1, a second ferromagnetic layer 2, a first reference electrode 1M, and a second reference electrode 2M), unlike the example shown in FIG. 6. Even in the above-described example, the impurities are added immediately below the reference electrodes 1M and 2M. Accordingly, for convenience, with respect to the regions, shallow regions immediately below the reference electrodes 1 and 2 are defined as R1M' and R2M', and deep regions are defined as R1M and R2M. Impurity concentrations of the shallow regions R1M' and R2M' and the deep regions R1M and R2M may be the same. However, the impurity concentrations of the shallow regions R1M' and R2M' may be relatively higher than those of the deep regions R1M and R2M so that spin resistance is small at a surface layer. Accordingly, it is possible to easily achieve electrical matching between the electrodes 1M and 2M and the semiconductor layer 3.

Further, when a shallow region immediately below the first ferromagnetic layer 1 is defined as R121 and a shallow region of the second ferromagnetic layer 2 is defined as R122, the regions can have a higher impurity concentration than the second region R12 located in a deeper region than the regions. It is understood that impurity concentrations of the regions R12, R121 and R122 may be the same. Since the spin resistance decreases even in the regions immediately below the first and second ferromagnetic layers 1 and 2, high spin current Sp2 can flow toward the second ferromagnetic layer 2. That is, since the second region R12 includes all regions in the semiconductor layer 3 immediately below the first and second ferromagnetic layers 1 and 2, the spin resistance decreases even in the regions immediately below the first and second ferromagnetic layers 1 and 2 such that the spin current easily flows. Accordingly, the spin current Sp2 reaching the second ferromagnetic layer 2 increases, leading to an improved output.

Figure 8:
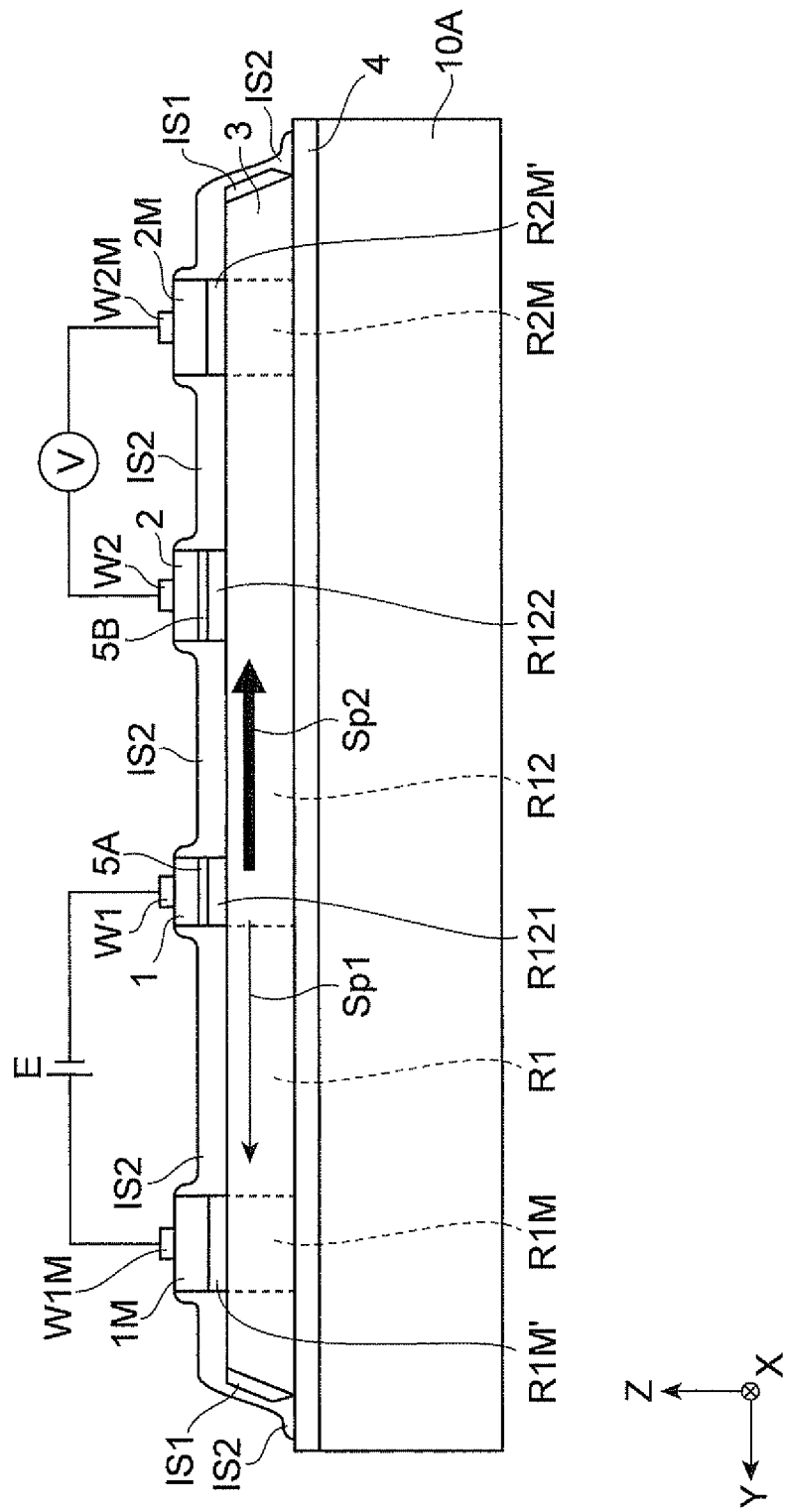
FIG. 8 is a view showing a cross-sectional configuration of a spin transport device having another different impurity concentration distribution.

FIG. 8 is a view showing a cross-sectional configuration of a spin transport device having another different impurity concentration distribution.

In the present example, a region of a surface layer to which impurities have not been added is removed, for example, by etching, or shallow semiconductor regions R1M, R2M, R121 and R122 to which impurities have been added are epitaxially grown on an original semiconductor layer 3, unlike the example shown in FIG. 7. In the case of this structure, since there is no low-concentration region in the surface layer of the semiconductor layer 3, there is no spin current propagating through such a region. Accordingly, efficiency of delivery of the spin current Sp2 to the second ferromagnetic material 2 increases. Further, dry etching such as milling or reactive ion etching, as well as wet etching, may be used for the etching. Further, a sputtering method or a CVD method, which is known in related art, may be used for the epitaxial growth.

Figure 9:
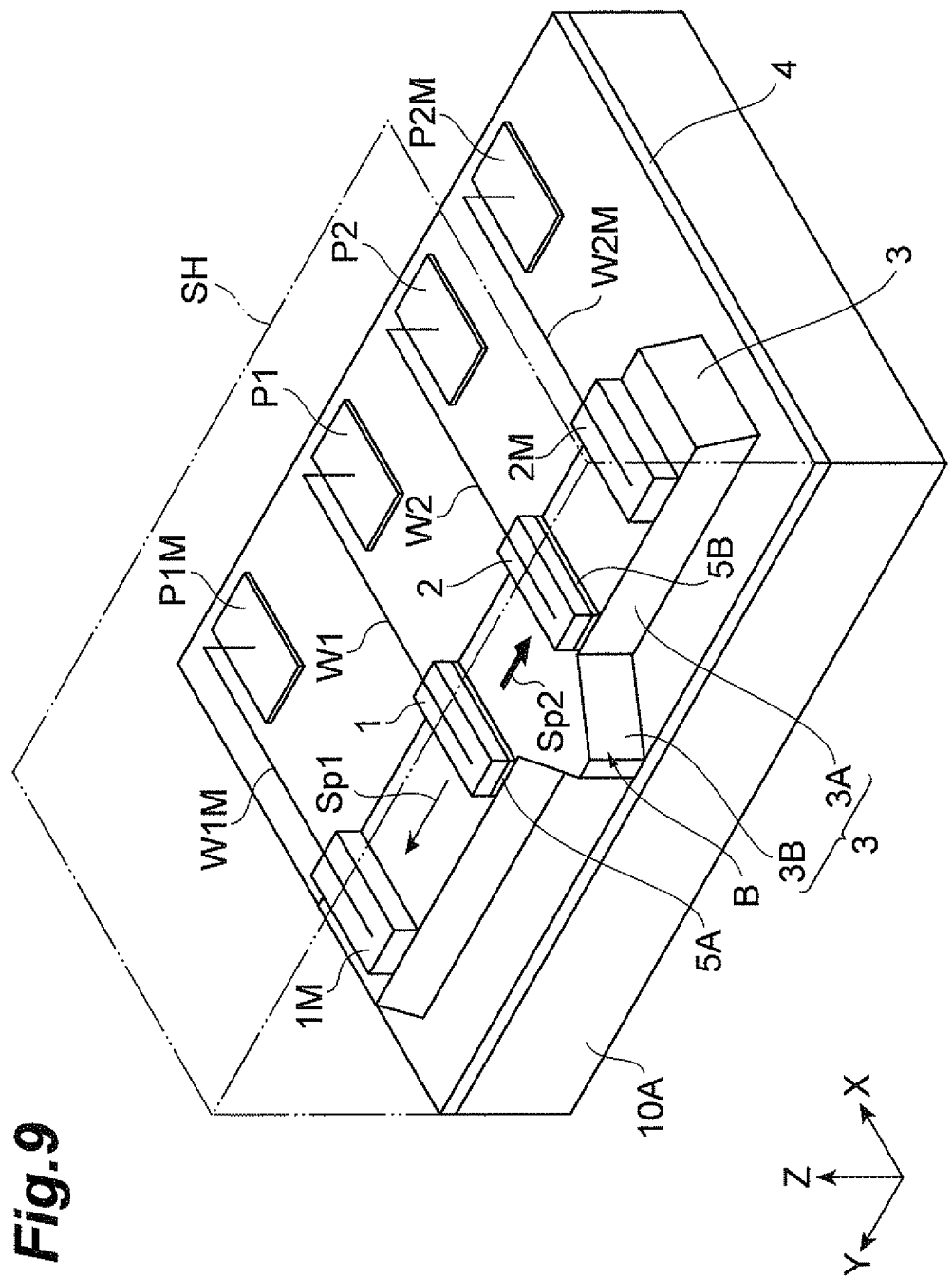
FIG. 9 is a perspective view of a spin transport device having another structure.

FIG. 9 is a perspective view of a spin transport device having a basic structure described above and functioning as a magnetic sensor. Electrode pads P1, P2, P1M and P2M are arranged at the same side from a semiconductor layer 3 as a boundary. The semiconductor layer 3 includes a protrusion 3B at an opposite side of the electrode pads P1, P2, P1M and P2M. An electric connection of this device is as shown in FIG. 2.

The semiconductor layer 3 includes a body part 3A and the protrusion 3B. The body part 3A has a shape of a tetragonal frustum or a rectangular parallelepiped in which a longitudinal direction is a Y axis direction, a transverse direction is an X axis direction, and a thickness direction is a Z axis direction. A planar shape of the protrusion 3B is a tetragonal frustum or a trapezoidal pillar. In a plan view, the protrusion 3B has a trapezoidal shape in which a size of a medium opposite surface is small. In this trapezoidal shape, an intersection line between the medium opposite surface and the XY plane is an upper base, and, in fact, there is no lower base since the protrusion 3B is continuous to the body part. However, virtually, a boundary line with the body part 3A may be regarded as a lower base of the trapezoid. The protrusion 3B is a part opposite to a magnetic recording medium. A magnetic field B is introduced into the semiconductor layer 3 via such a part.

If the magnetic field is introduced into the semiconductor layer 3, spin current Sp2 from the first ferromagnetic layer 1 to the second ferromagnetic layer 2 is affected by the magnetic field B and thus the direction of the spin rotates. Since a rotation amount of the direction of the spin is proportional to the magnitude of the magnetic field and a magnetization direction of the rotating spin is coincident with the magnetization direction of the second ferromagnetic layer 2, the output voltage indirectly measures the magnitude of the magnetic field B.

Further, a magnetic shield SH is provided in the base substrate 10A to surround a longitudinal direction of the semiconductor layer 3. Only the protrusion 3B passes through the magnetic shield SH and faces the magnetic recording medium. Here, if the base substrate 10A is formed of Si, an insulating layer 4 is formed of, for example, $Al_2O_3$, and the semiconductor layer 3 is a Si layer epitaxially grown on the insulating layer 4, the substrate becomes an SOI (Silicon on Insulator) substrate. In the SOI substrate, since a thickness of the semiconductor layer 3 can be set to be thin, there is an advantage that an influence of a deep position is less and noise is reduced as in a normal semiconductor substrate. The thickness of the semiconductor layer 3 is preferably 0.4 nm to 70 nm from the view point of suppressing noise. However, the thickness may have a greater value, such as 100 nm. Further, the base substrate 10A may be formed of a magnetic shield material.

Further, an impurity concentration distribution is the same as those in the above-described examples (FIGS. 1 to 8). However, since the protrusion 3B is not present in a position that causes the spin current Sp2 to be directed to the second ferromagnetic layer 2, it is unnecessary to greatly add impurities and the impurity concentration may be at a low impurity concentration state before the impurities are added, that is, may be the same concentration as the first region R1 described above.

While the semiconductor layer 3 is formed of an epitaxial layer grown on the insulating layer 4 herein, the semiconductor layer 3 may be formed by adhering a semiconductor film formed of a crystal layer of a single domain cut from a bulk to the insulating layer 4.

Figure 10:
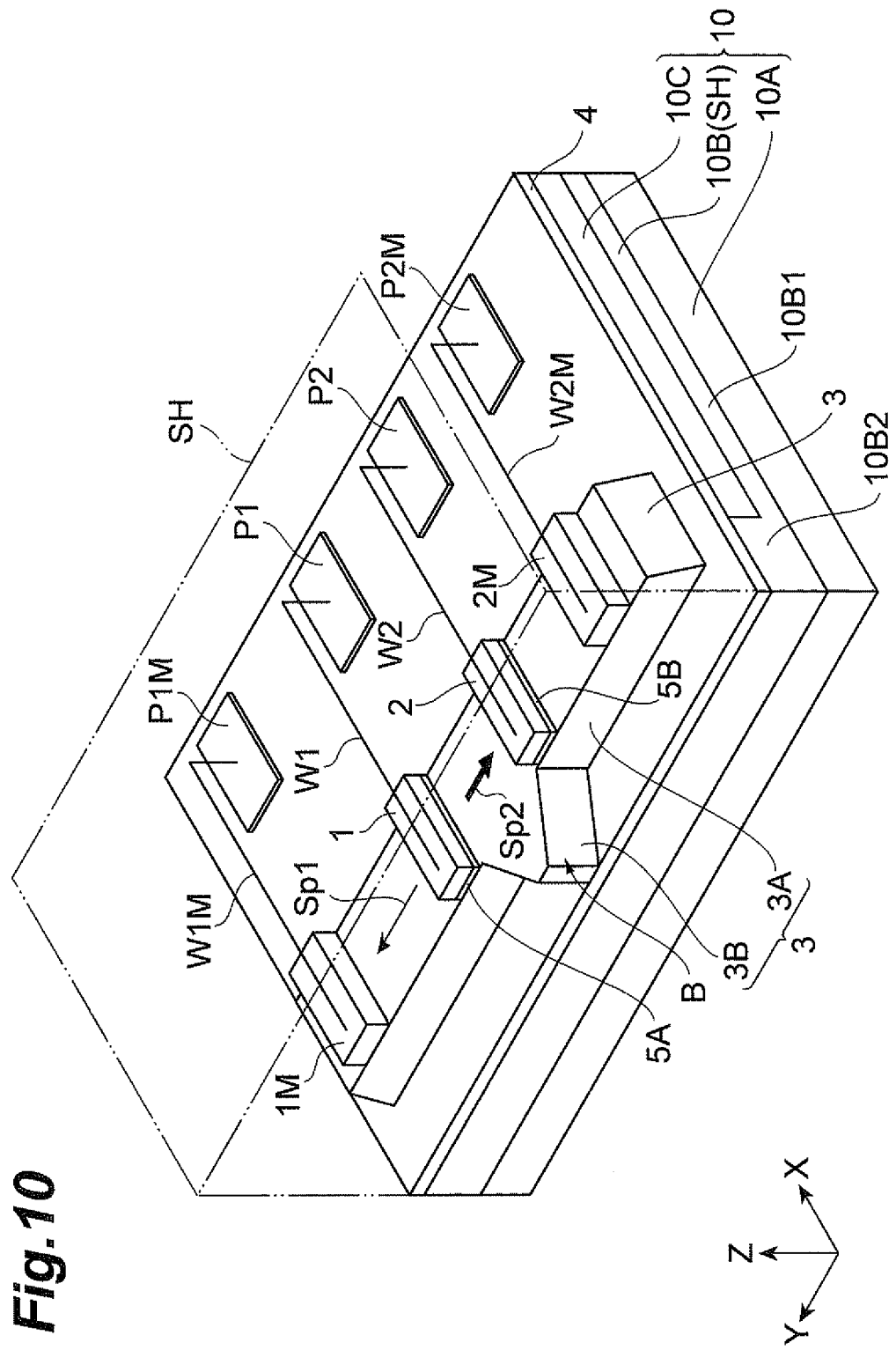
FIG. 10 is a perspective view of a spin transport device having still another structure.

FIG. 10 is a perspective view of a spin transport device using a semiconductor crystal layer of a single domain as the semiconductor layer 3.

The spin transport device shown in FIG. 10 differs from the magnetic sensor shown in FIG. 9 in that a magnetic shield 10B and an insulating layer 10C are provided between the base substrate 10A and the insulating layer 4 shown in FIG. 9 and a semiconductor crystal layer of a single domain is used as the semiconductor layer 3. Other configurations of the spin transport device shown in FIG. 10 are the same as those shown in FIG. 9. Further, in the description, see FIG. 23 for a detailed structure of the magnetic shield SH. Further, an electric connection of this device is as shown in FIG. 2.

This magnetic sensor includes a base substrate 10 and the semiconductor layer 3 formed of a crystal layer of a bulk of a single domain adhered to the base substrate 10 via the insulating film 4. The base substrate 10 is formed by stacking a lower base substrate 10A, a lower magnetic shield 10B, and an upper base substrate 10C. A first ferromagnetic layer 1 is formed on a surface of the semiconductor layer 3 opposite to the insulating film 4 via a first tunnel barrier layer 5A.

Similarly, a second ferromagnetic layer 2 is formed on a surface of the semiconductor layer 3 opposite to the insulating film 4 via a second tunnel barrier layer 5B.

Figure 23:
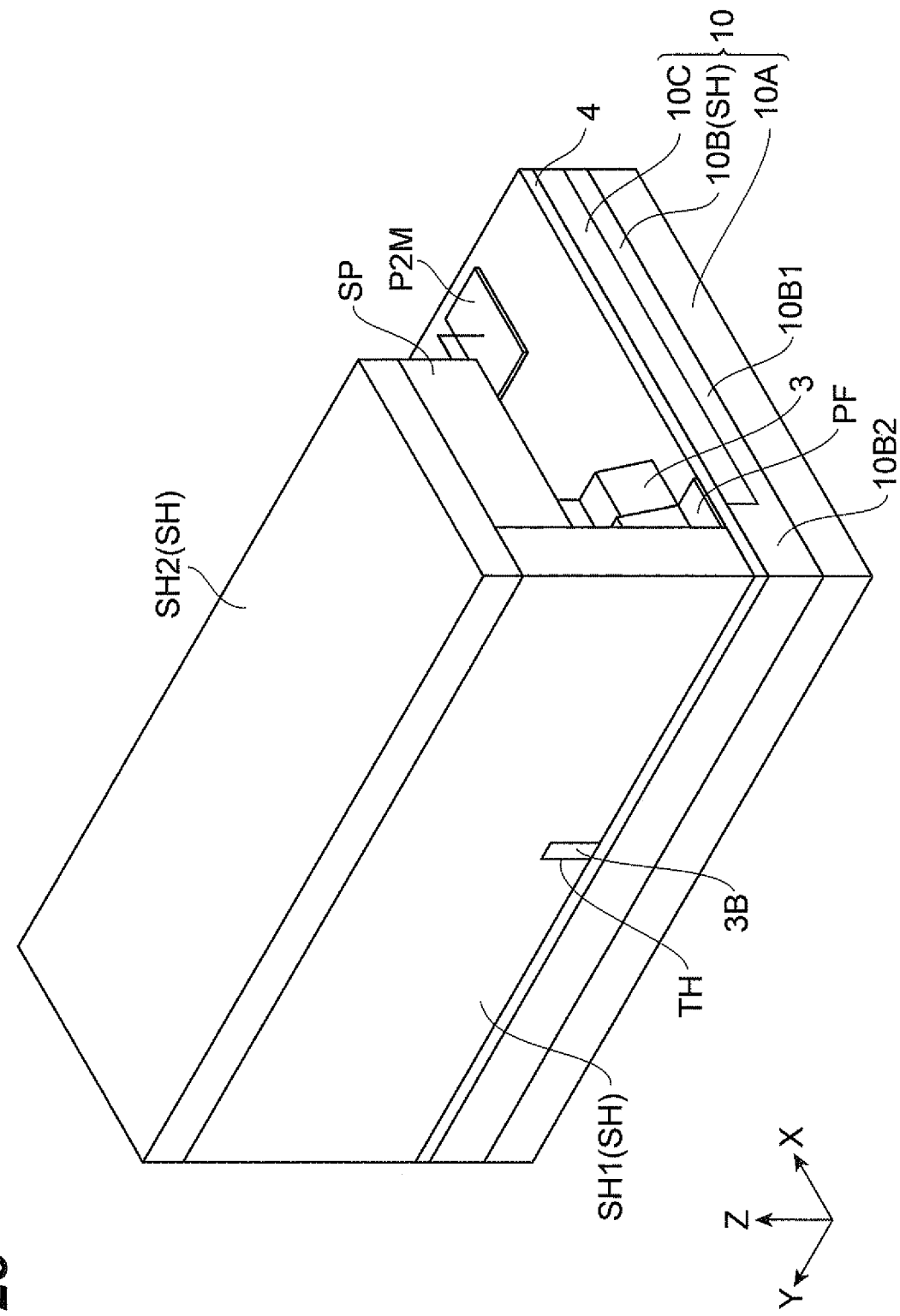
FIG. 23 is a perspective view of the spin transport device illustrating the method of fabricating the spin transport device.

As shown in FIG. 23, introduction of a magnetic field from the outside of the base substrate 10 to the semiconductor layer 3 is suppressed by the magnetic shield 10B, introduction of a magnetic field from a medium opposite surface to the semiconductor layer 3 is suppressed by a magnetic shield SH1, and introduction of a magnetic field from an opposite side of the magnetic shield 10B of the base substrate 10 to the semiconductor layer 3 is suppressed by a magnetic shield SH2.

Here, the semiconductor layer 3 of the present example is not formed by growth of a thin film on the insulating layer. A layer obtained by cutting a single crystalline ingot made by a CZ (Czochralski) method or an FZ (Floating Zone) method, through slicing, is used as the semiconductor layer 3. The semiconductor layer 3 may be formed as a thin film by performing polishing after bonding, if necessary. That is, for the semiconductor layer 3 to be fabricated from a single crystal of a single domain, the semiconductor layer 3 is made in another process and adhered to the base substrate 10 via the insulating film 4 without using crystal growth on the insulating layer. As another process, for example, a crystal growth method using an MBE method may be used.

Crystallinity of the semiconductor crystal layer of the bulk is higher than that of the semiconductor crystal layer formed using growth of a thin film on the insulating film. Accordingly, if this semiconductor layer 3 is used as a spin transport layer, a spin transport characteristic is improved, and constraints on improvement of the output, improvement of magnetic field resolution, and device fabrication are relaxed.

When electrons flow between the first ferromagnetic layer 1 and the second ferromagnetic layer 2, the spin rotates due to the magnetic field B and the output is changed. However, since the semiconductor layer 3 is formed of the bulk crystal of the single domain, the crystallinity of the semiconductor layer 3 is higher than that of a semiconductor crystal layer for an SOI substrate made by crystal growth. Accordingly, a spin transport characteristic can be improved and a more precise measurement can be performed.

In a spin transport type magnetic sensor having this structure, a YZ plane at a side of a negative direction of the X axis constitutes a medium opposite surface (air bearing surface; ABS). The magnetic field B is introduced from the magnetic recording medium opposite to the medium opposite surface into the body part 3A, which is a channel of the semiconductor layer 3, via the protrusion 3B. In the semiconductor crystal layer body part 3A, polarization of the spin rotates.

Accordingly, the output voltage depends on the magnitude of the magnetic field introduced into the semiconductor layer 3 and the device functions as a magnetic sensor. Here, since the semiconductor crystal layer is formed from a bulk, the crystallinity of the semiconductor crystal layer is higher than that of a semiconductor crystal layer for an SOT substrate made by crystal growth. Accordingly, a spin transport characteristic can be improved and a more precise measurement can be performed.

Thus, the semiconductor layer 3 includes the protrusion 3B having a tip located at the medium opposite surface in a magnetic head. In this case, the magnetic field B can be introduced into the semiconductor layer 3 via the protrusion 3B.

In particular, the body part 3A, which is the semiconductor layer 3 other than the protrusion 3B, is surrounded by the magnetic shield SH (including 10B) around the Y axis and thus is less susceptible to the magnetic field. That is, the magnetic sensor further includes a magnetic shield SH1 (SH) having a through-hole TH (see FIG. 23) in which the protrusion 3B is located. This through-hole TH is located in a lateral direction (a negative direction of the X axis) of a region between the first ferromagnetic layer 1 and the second ferromagnetic layer 2 in the semiconductor layer 3. A length of one side of the through-hole TH (a length in the Y axis direction) in the medium opposite surface may be, for example, 0.005 μm to 0.1 μm, and a length of the other side (a length in the Z axis direction) may be, for example, 0.001 μm to 0.1 μm. Since the magnetic shield SH (particularly, the lateral magnetic shield SH1: see FIG. 23) is located in a lateral direction of the semiconductor layer 3, the magnetic field is not introduced from parts other than the protrusion 3B into the inside and an accurate measurement can be realized.

Next, materials of the magnetic shield and the like will be described.

The lower base substrate 10A is formed of a material having high insulation, for example, a semiconductor such as AlTiC, $Al_2O_3$ or Si.

A material of the magnetic shield SH, including the lower magnetic shield 10B, is, for example, a soft magnetic material such as an alloy containing Ni and Fe, Sendust, an alloy containing Fe and Co, or an alloy containing Fe, Co, and Ni. One example of the material is NiFe. Further, a thickness in the Z axis direction of the lateral magnetic shield SH1 standing in a lateral portion is greater than that of the semiconductor layer 3 and is, for example, 0.02 μm to 1 μm. Similarly, thicknesses in the Z axis direction of the upper magnetic shield SH2 and the lower magnetic shield 10B are 0.02 μm to 1 μm.

The upper base substrate 10C is formed of an insulating layer buried in the lower magnetic shield 10B, and $SiO_2$, SiNx, MgO, $Al_2O_3$ or the like may be used. Further, the lower magnetic shield 10B includes a first magnetic shield 10B1 in contact with a lower surface of the upper base substrate 10C, and a second magnetic shield 10B2 in contact with a side surface of the upper base substrate 10C. An XZ cross-sectional shape of the lower magnetic shield 10B is an L shape.

A thickness of the semiconductor layer 3 is 0.4 nm to 70 nm. In this case, there is an advantage in that it is possible to suppress a background voltage to be low. When the semiconductor layer 3 is too thin, there is a problem in that the semiconductor layer 3 cannot exist as a single crystalline film. Accordingly, the thickness of the semiconductor layer 3 is preferably 0.4 nm or more. That is, in the magnetic sensor, it is advantageous for the semiconductor layer 3 to have a small thickness. When a semiconductor crystal layer is formed on an insulating layer through crystal growth as in an SOT substrate in the related art, a crystal layer that is too thin does not provide sufficient crystallinity of the semiconductor crystal layer. On the other hand, when a bulk semiconductor layer 3 is used, a small thickness provides high crystallinity. Accordingly, noise can be sufficiently reduced.

Next, a method of fabricating a magnetic sensor will be described with reference to FIGS. 11 to 23.

Figure 11:
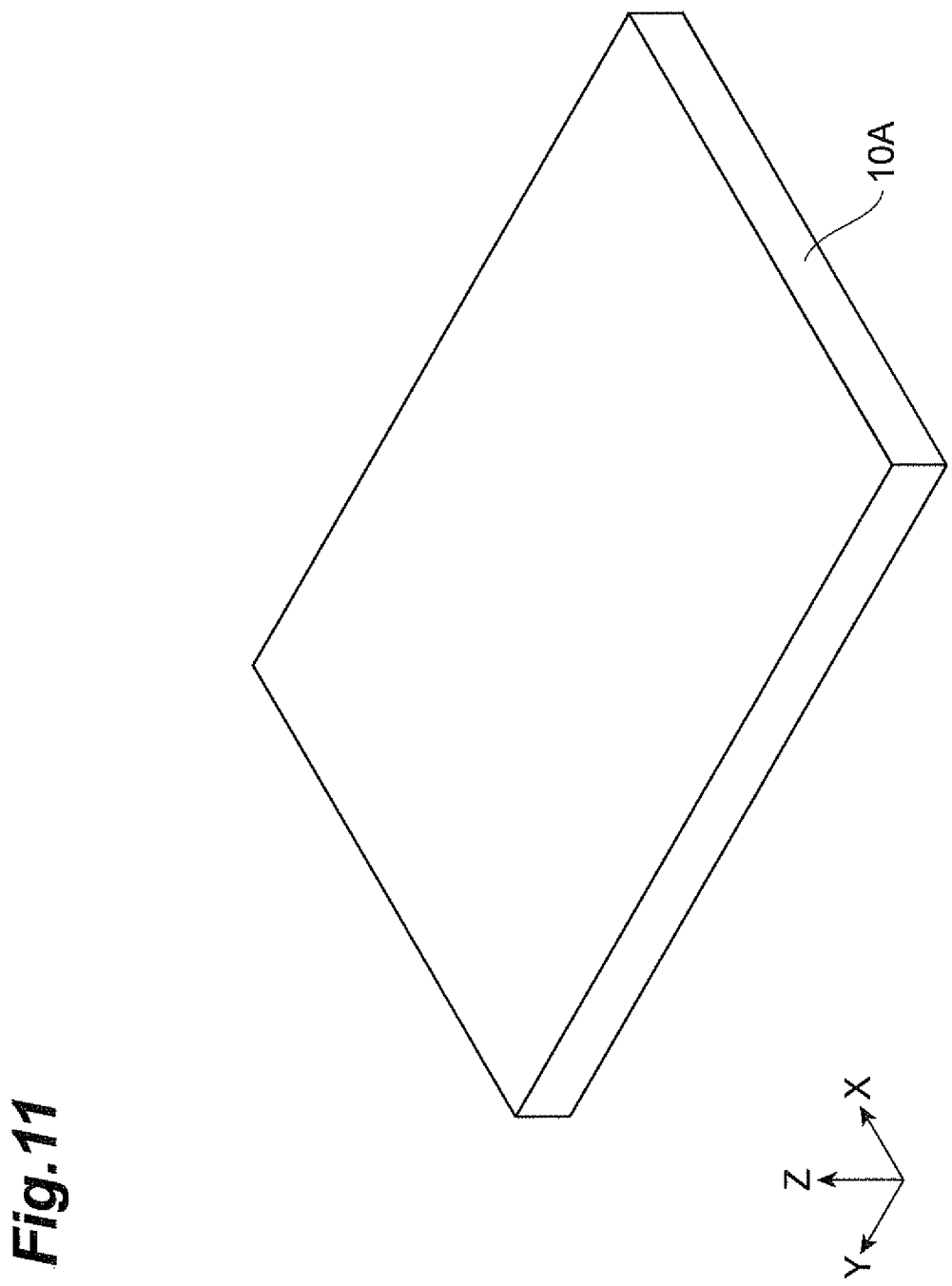
FIG. 11 is a perspective view of a spin transport device intermediate body illustrating a method of fabricating a spin transport device.

First, as shown in FIG. 11, a lower base substrate 10A is prepared. In the present example, the lower base substrate 10A is formed of AlTiC. The rectangular plate-shaped lower base substrate 10A is shown in FIG. 11, but this is a final shape after dicing. In fact, an initially prepared substrate is a wafer having a diameter of 6 inch. Alternatively, an SOI substrate may be used as the lower base substrate 10A. An appropriate alignment mark is formed in the lower base substrate 10A and used as a standard in subsequent patterning.

Figure 12:
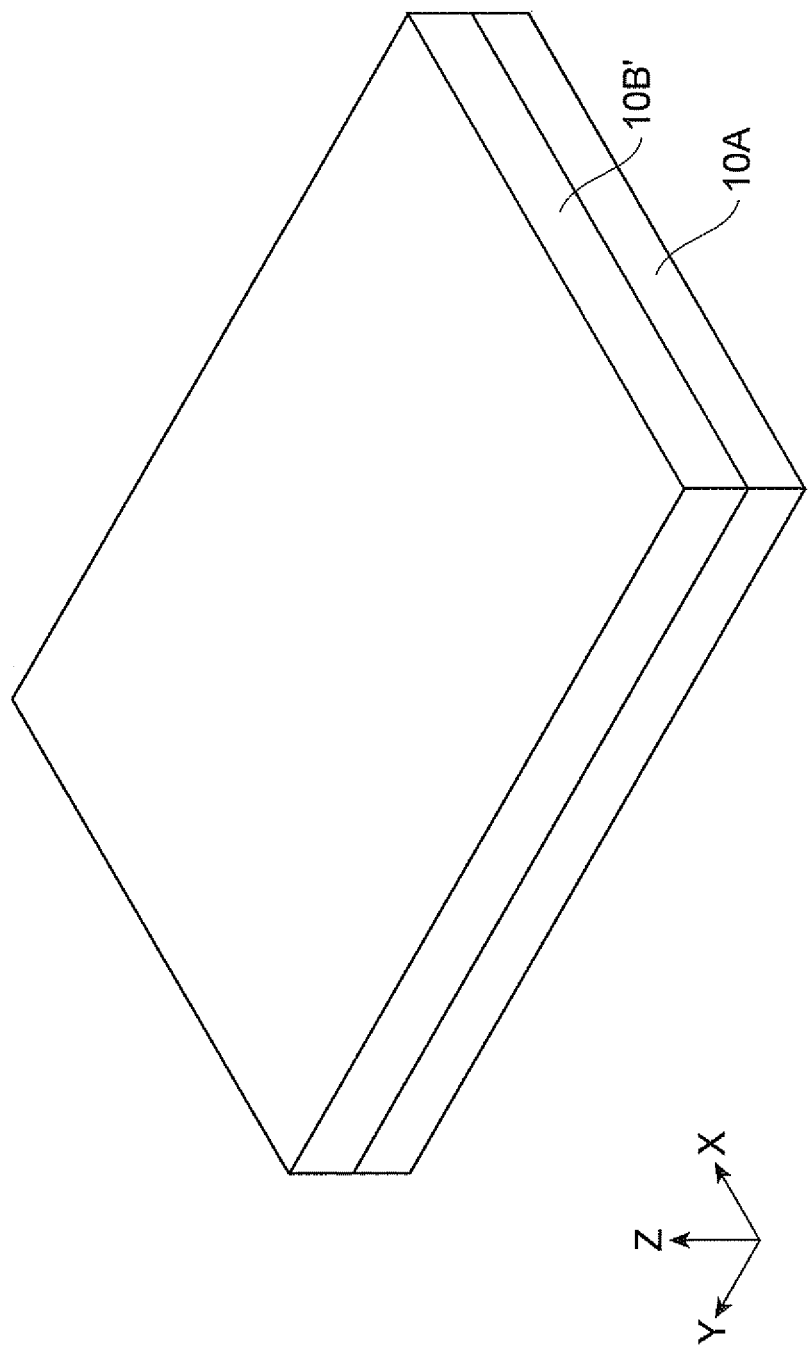
FIG. 12 is a perspective view of the spin transport device intermediate body illustrating the method of fabricating a spin transport device.

Next, as shown in FIG. 12, a magnetic layer 10B', which is the lower magnetic shield 10B, is formed on the lower base substrate 10A. This magnetic layer 10B' is formed of a soft magnetic material, for example, NiFe. For example, a sputtering method may be used as a forming method.

Figure 13:
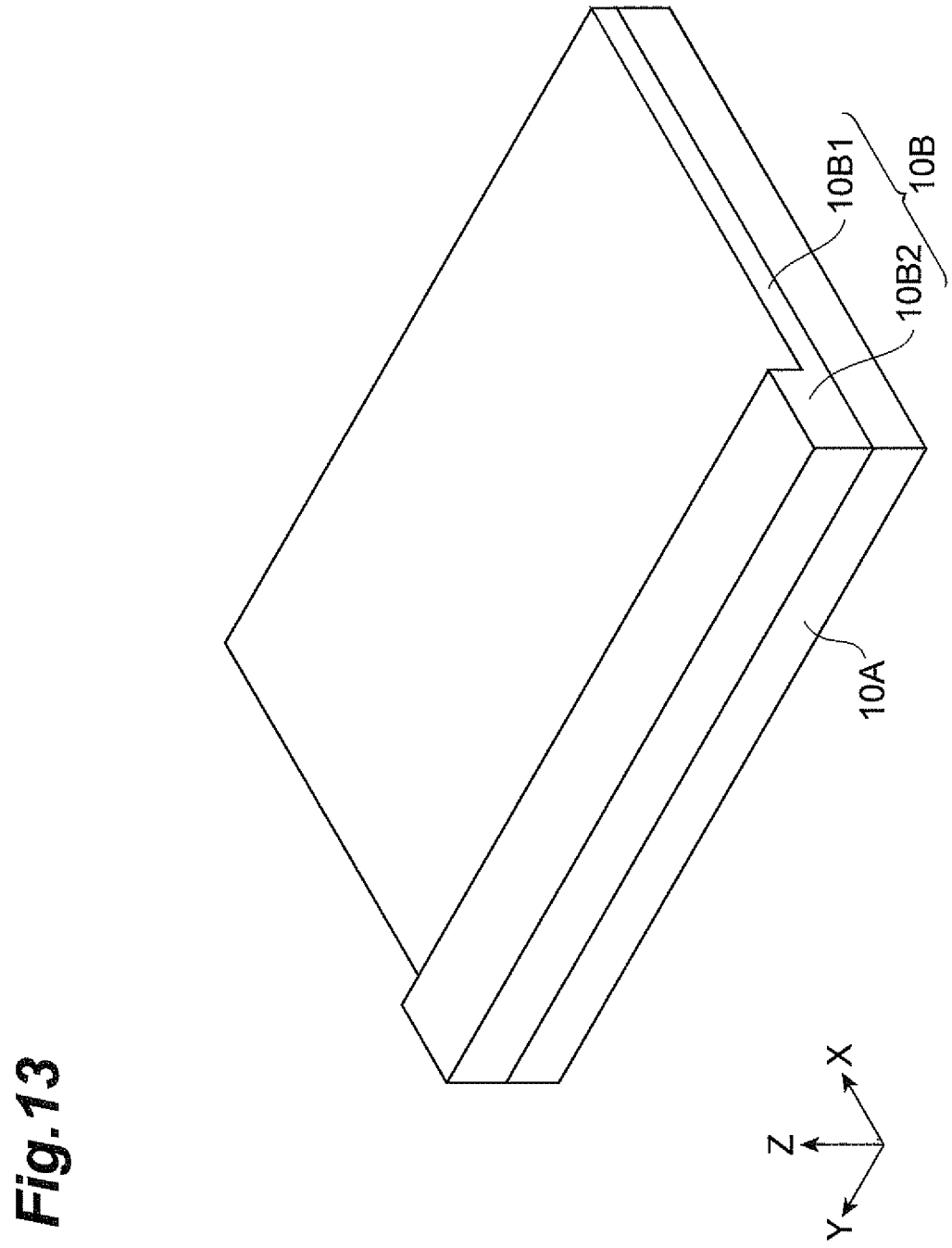
FIG. 13 is a perspective view of the spin transport device intermediate body illustrating the method of fabricating a spin transport device.

Then, as shown in FIG. 13, the magnetic layer 10B' is processed so that an XZ cross-section of the magnetic layer 10B' has an L shape, and a step having a boundary line extending in parallel to a Y axis is formed. An ion milling method using Ar or a known reactive ion etching (RIE) method may be used for this process.

Figure 14:
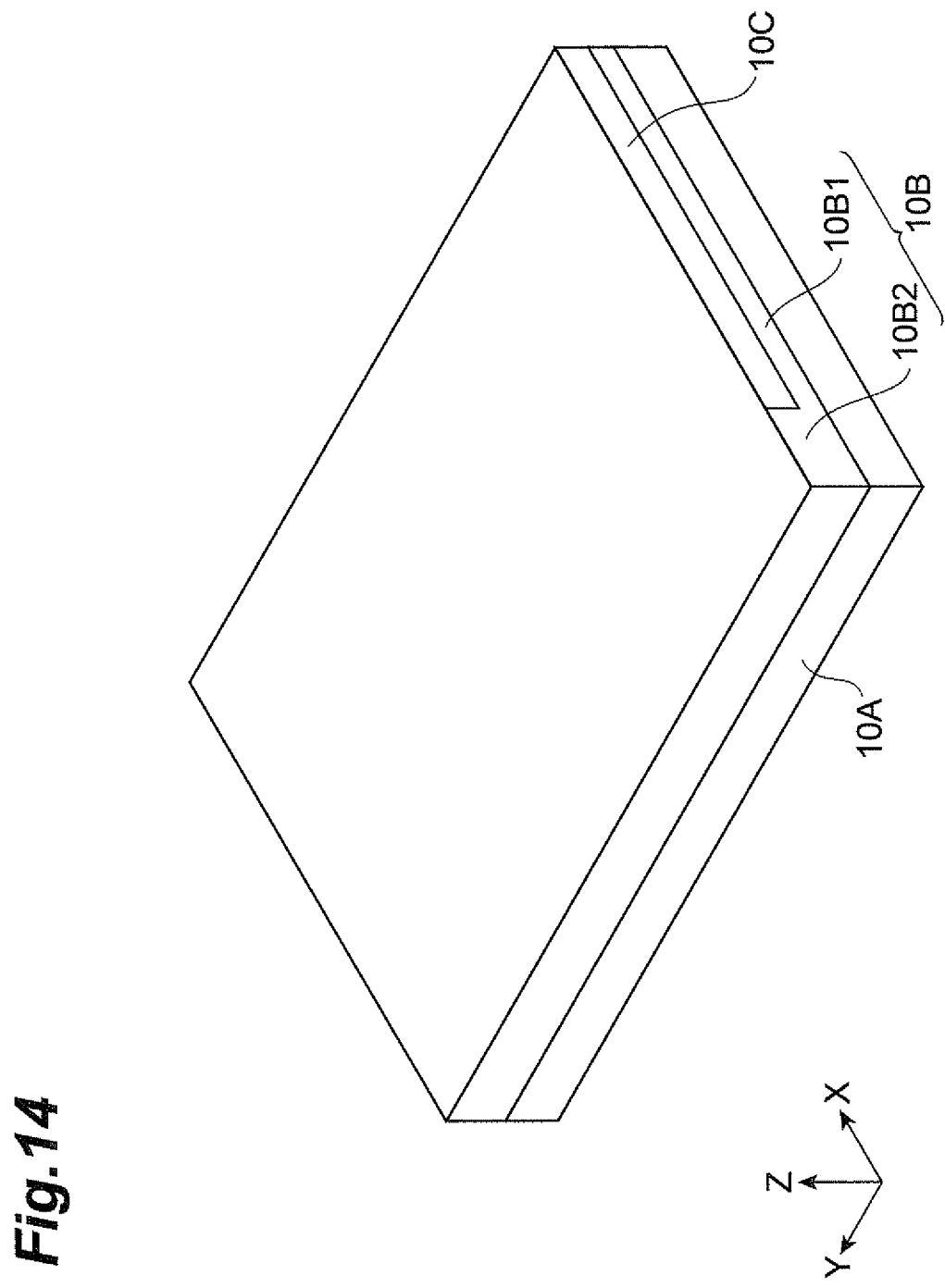
FIG. 14 is a perspective view of the spin transport device intermediate body illustrating the method of fabricating a spin transport device.

Next, as shown in FIG. 14, an upper base substrate 10C formed of an insulator is formed on the entire upper surface of the lower magnetic shield 10B and subjected to chemical mechanical polishing (CMP) using a polishing member having a polishing surface parallel to an XY plane until a surface of the second magnetic shield 10B2 is exposed, and the exposed surface of the second magnetic shield 10B2 is planarized.

Figure 15:
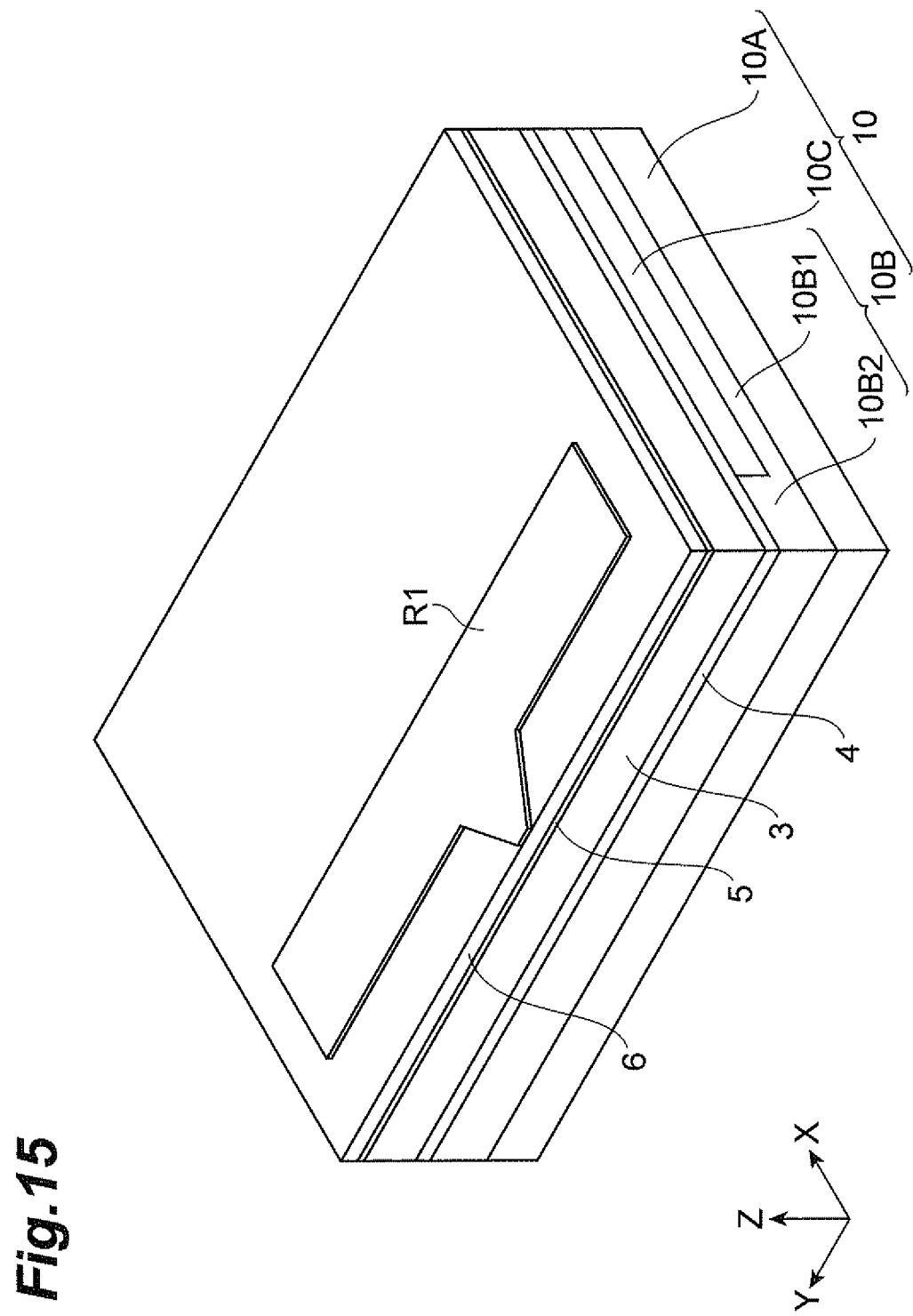
FIG. 15 is a perspective view of the spin transport device intermediate body illustrating the method of fabricating a spin transport device.

Next, a semiconductor layer (semiconductor substrate) 3 formed of a bulk crystal layer for bonding is prepared. This semiconductor layer 3 is a single crystalline semiconductor substrate made using an FZ method or a CZ method, and is Si in the present example. A surface of the semiconductor layer 3 (e.g., 100 nm thick) is thermally oxidized to form an insulating layer 4 (e.g., 20 nm thick) of $SiO_2$ on the surface. A method of forming the insulating layer 4 may include a sputtering method or a chemical vapor phase growth (CVD) method. This semiconductor layer 3 is processed to have an appropriate size through dicing, if necessary, and adhered to the surface of the above-described base substrate 10, as shown in FIG. 15.

The upper base substrate 10C formed of an insulator is located at a top surface of the base substrate 10, and the insulating layer 4 is formed on a surface of the semiconductor layer 3. Accordingly, the insulators are brought into contact with each other and heat and pressure are applied thereto to fix the semiconductor layer 3 to the base substrate 10.

In addition, the exposed surface of the semiconductor layer 3 is cleaned. For cleaning, so-called RCA cleaning may be used. In the RCA cleaning, a hydrofluoric acid solution (HF) is brought into contact with the exposed surface, ammonia ($NH_4OH$) plus hydrogen peroxide ($H_2O_2$) is brought into contact with the exposed surface, and then hydrochloric acid (HCl) plus hydrogen peroxide ($H_2O_2$) is brought into contact with the exposed surface. Lastly, cleaning is performed with pure water. Here, the addition of impurities described above is carried out.

That is, a mask ($SiO_2$) having openings corresponding only to regions to which impurities are to be added is patterned on the semiconductor layer 3, and impurities are added into the semiconductor layer 3 via this mask. A diffusion method or an ion implantation method may be used for the addition. After the impurities are added, heat treatment (annealing) is performed to activate the impurities and diffuse the impurities in the semiconductor layer 3. An annealing temperature may be 900° C. After the impurities are added, the mask is removed using an HF solution and a surface of the semiconductor layer 3 is cleaned. In fabrication, after such impurity addition, respective layers are sequentially formed on the semiconductor layer 3.

Then, MgO (1 nm to 1.5 nm) is formed as a tunnel barrier layer 5 on the surface of the semiconductor layer 3 using a beam molecular beam epitaxy (MBE) method, Fe (5 nm to 10 nm) is formed on the tunnel barrier layer 5, a Ti layer (3 nm) is formed on the Fe, and a CoFe layer, a Ru layer and a CoFe layer are sequentially formed on the Ti layer using a sputtering method, to thereby form a ferromagnetic layer 6 (which becomes ferromagnetic layers 1 and 2 after patterning shaping). Further, an antiferromagnetic layer (IrMn) is formed on the CoFe layer at a top surface constituting the ferromagnetic layer 6 (see FIGS. 26A and 26B: antiferromagnetic layers 1AF and 2AF), and an Ru layer and a Ta layer are formed as a barrier film BR on the antiferromagnetic layer (see FIGS. 26A and 26B), if necessary, but the layers are not shown in FIG. 15, for clarity of structure.

Next, annealing is performed under a magnetic field to fix a magnetization direction of the ferromagnetic layer 6. For example, the magnetization direction is fixed to a negative direction of the Y axis.

Figure 16:
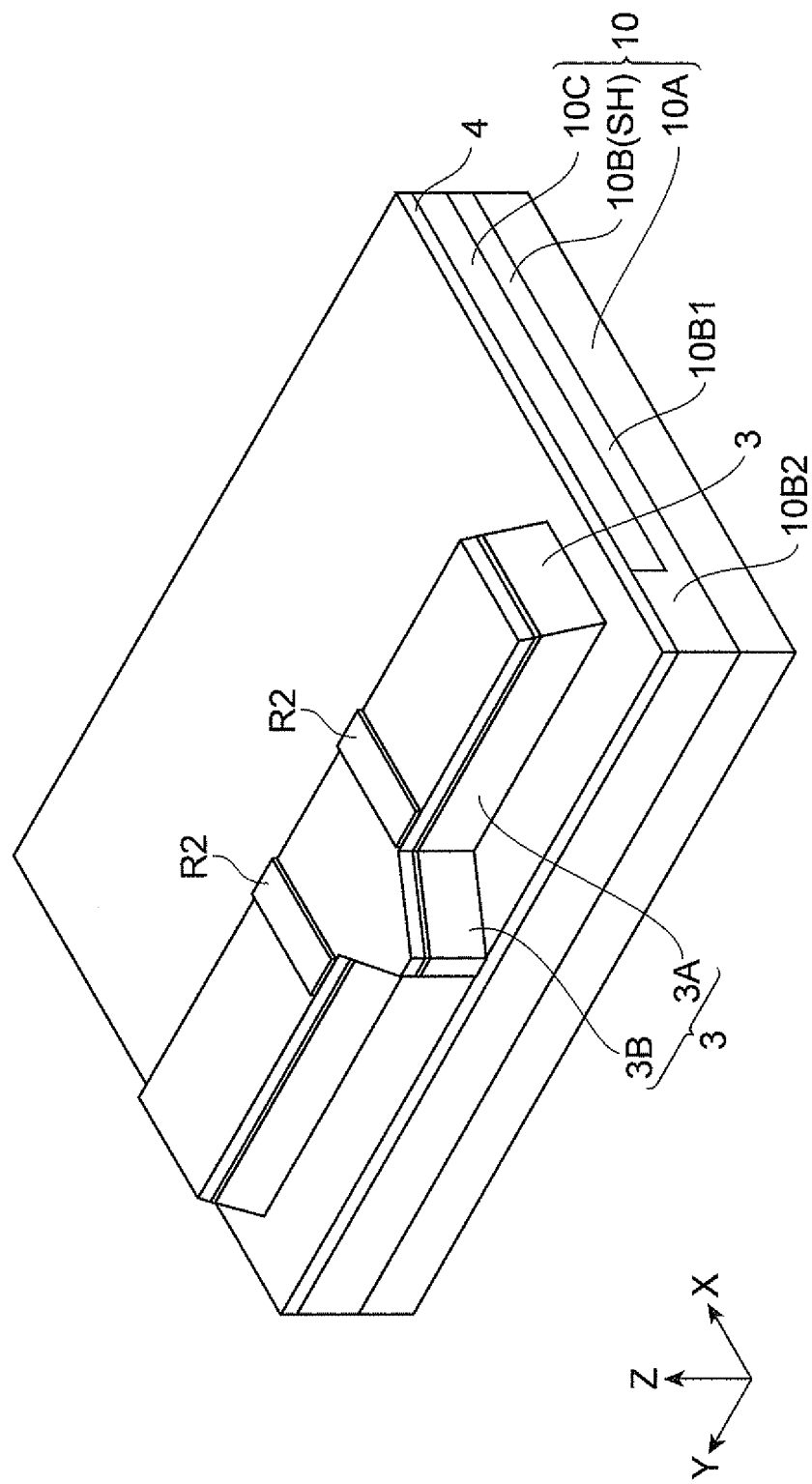
FIG. 16 is a perspective view of the spin transport device intermediate body illustrating the method of fabricating a spin transport device.

Next, as shown in FIG. 15, a photoresist is coated and patterned to form a mask R1 on the ferromagnetic layer 6 (barrier layer). The regions of the respective layers 6, 5 and 3 not covered with the mask R1 are removed through ion milling using the mask R1 to thereby expose the insulating layer 4, as shown in FIG. 16. Alternatively, chemical etching together with the ion milling may be used.

Then, an insulating layer IS1 (20 nm thick: see FIGS. 2 to 4) covering a side surface of the exposed semiconductor layer 3 is formed and then the mask R1 is removed.

Next, as shown in FIG. 16, a photoresist is coated and then patterned to form a second mask R2 on the ferromagnetic layer 6 (barrier layer). This mask R2 includes a pair of regions extending in the X axis direction. An exposed region of the ferromagnetic layer 6 (barrier layer) is removed by ion milling or chemical etching using the mask R2 until the tunnel barrier layer 5 or the semiconductor layer 3 is exposed, an insulating layer IS2 (20 nm thick: see FIGS. 2 to 4) covering the exposed semiconductor layer 3 is formed, and then the mask R2 is removed.

Figure 17:
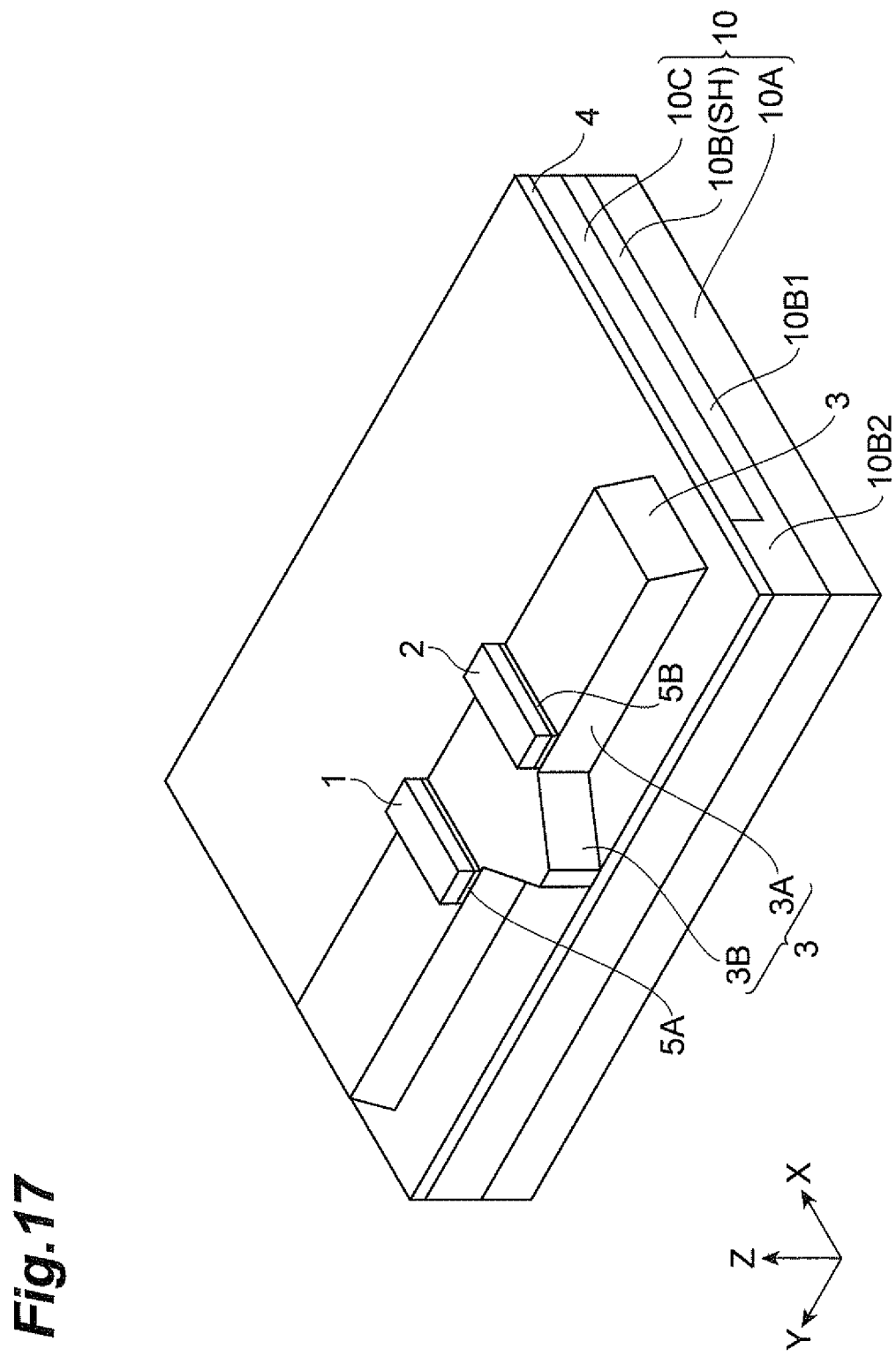
FIG. 17 is a perspective view of the spin transport device intermediate body illustrating the method of fabricating a spin transport device.
Figure 18:
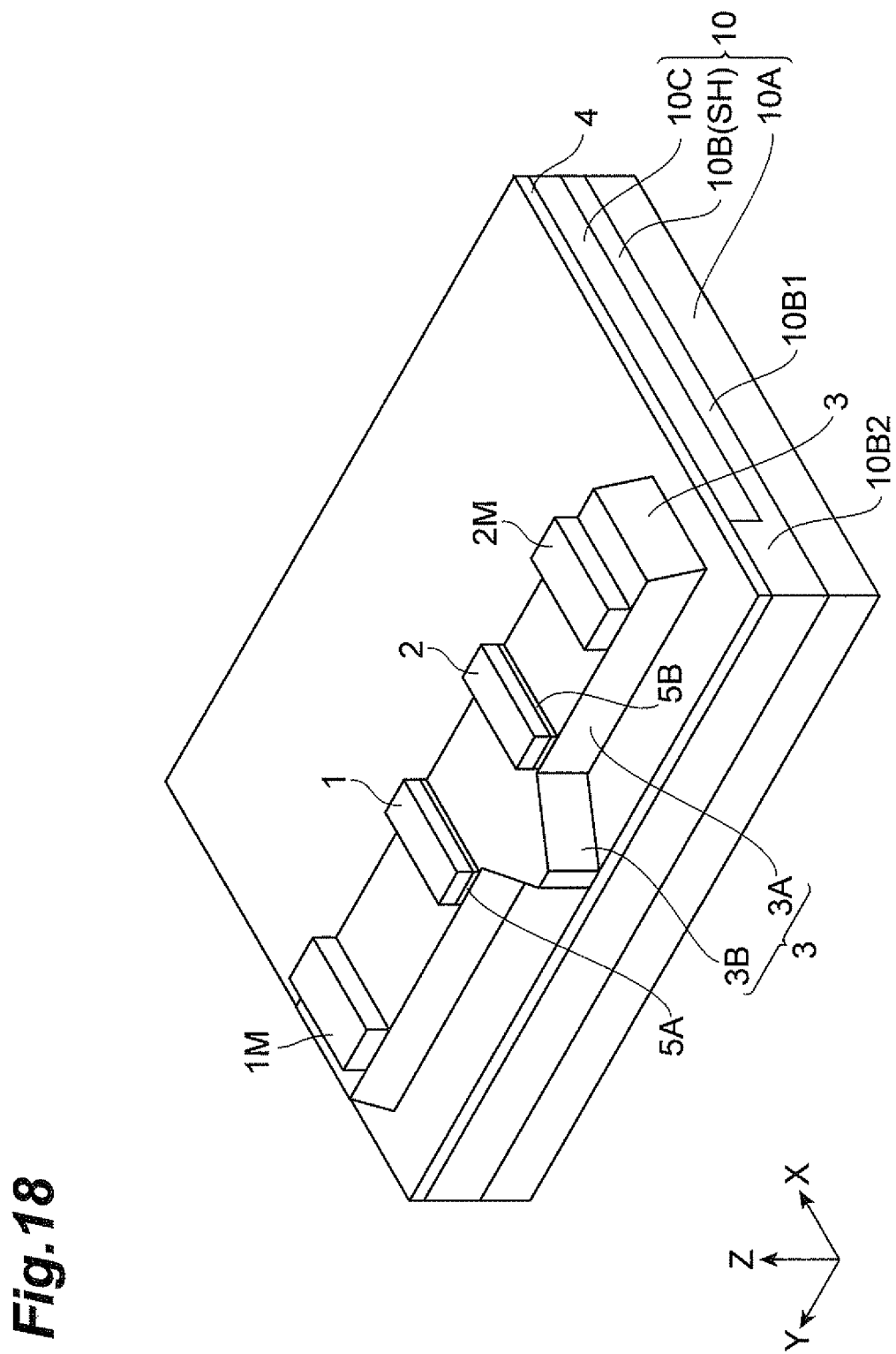
FIG. 18 is a perspective view of the spin transport device intermediate body illustrating the method of fabricating a spin transport device.

As shown in FIG. 17, here, the remaining ferromagnetic layers are used as a first ferromagnetic layer 1 and a second ferromagnetic layer 2. When spin current type detection is performed, a first electrode 1M and a second electrode 2M are formed on the exposed surface of the semiconductor layer 3, as shown in FIG. 18. For this formation, a sputtering method or an evaporation method may be used. Further, when the tunnel barrier layer or the insulating layer is exposed and remains in regions in which the electrodes are to be formed, the tunnel barrier layer or the insulating layer in the regions is removed by patterning and etching using a photoresist.

Figure 19:
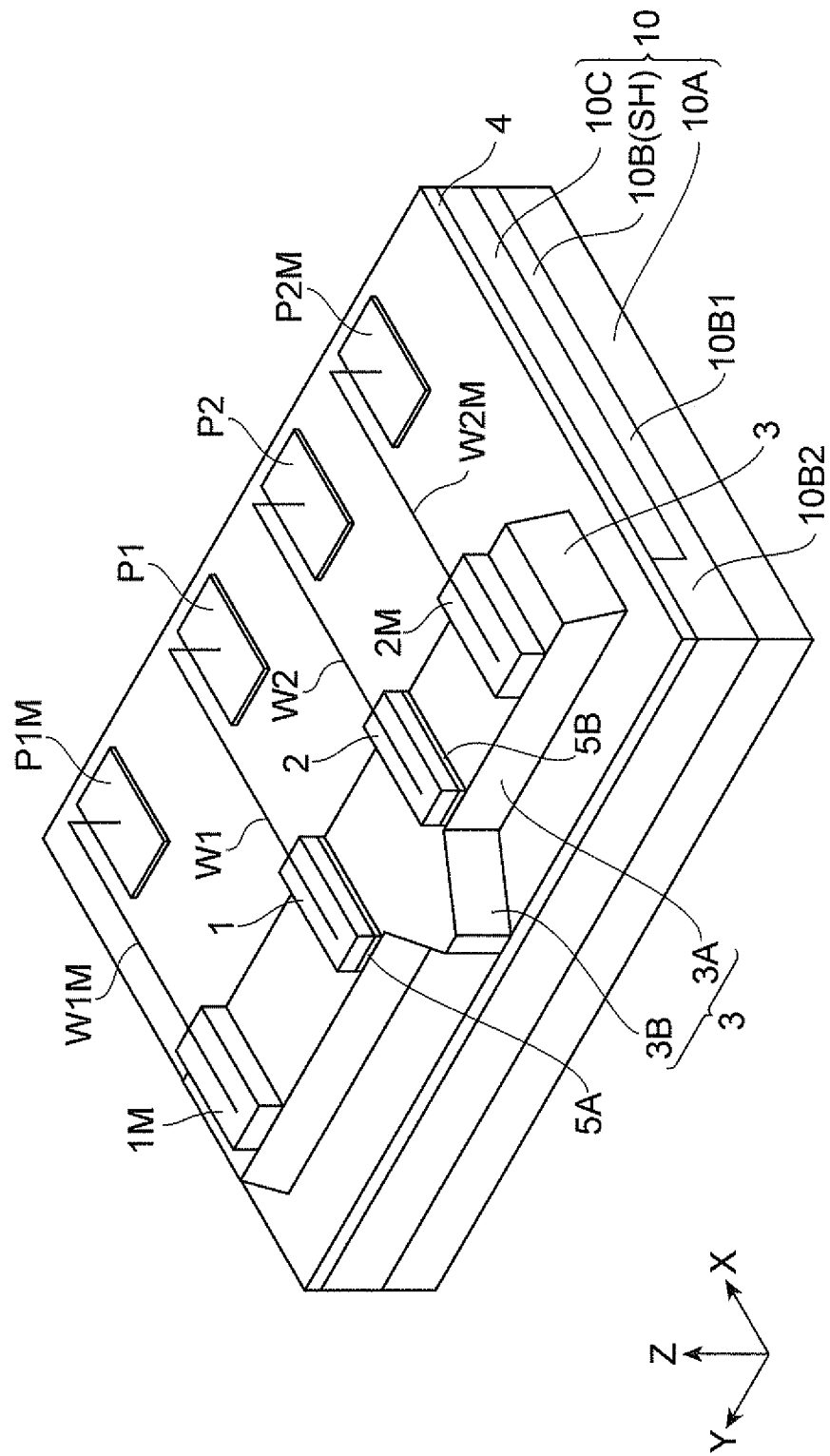
FIG. 19 is a perspective view of the spin transport device intermediate body illustrating the method of fabricating a spin transport device.

In addition, four electrode pads P1, P2, P1M and P2M are formed in appropriate positions spaced from the semiconductor layer 3 on the base substrate 10, for example, using an evaporation method, as shown in FIG. 19. Next, the electrode pads P1, P2, P1M and P2M are connected to the first ferromagnetic layer 1, the second ferromagnetic layer 2, the first electrode 1M, and the second electrode 2M using wirings W1, W2, W1M and W2M, respectively. That is, ends of the wirings W1, W2, W1M and W2M are electrically and physically connected to the respective layers 1, 2, 1M and 2M, as shown in FIG. 19.

Figure 20:
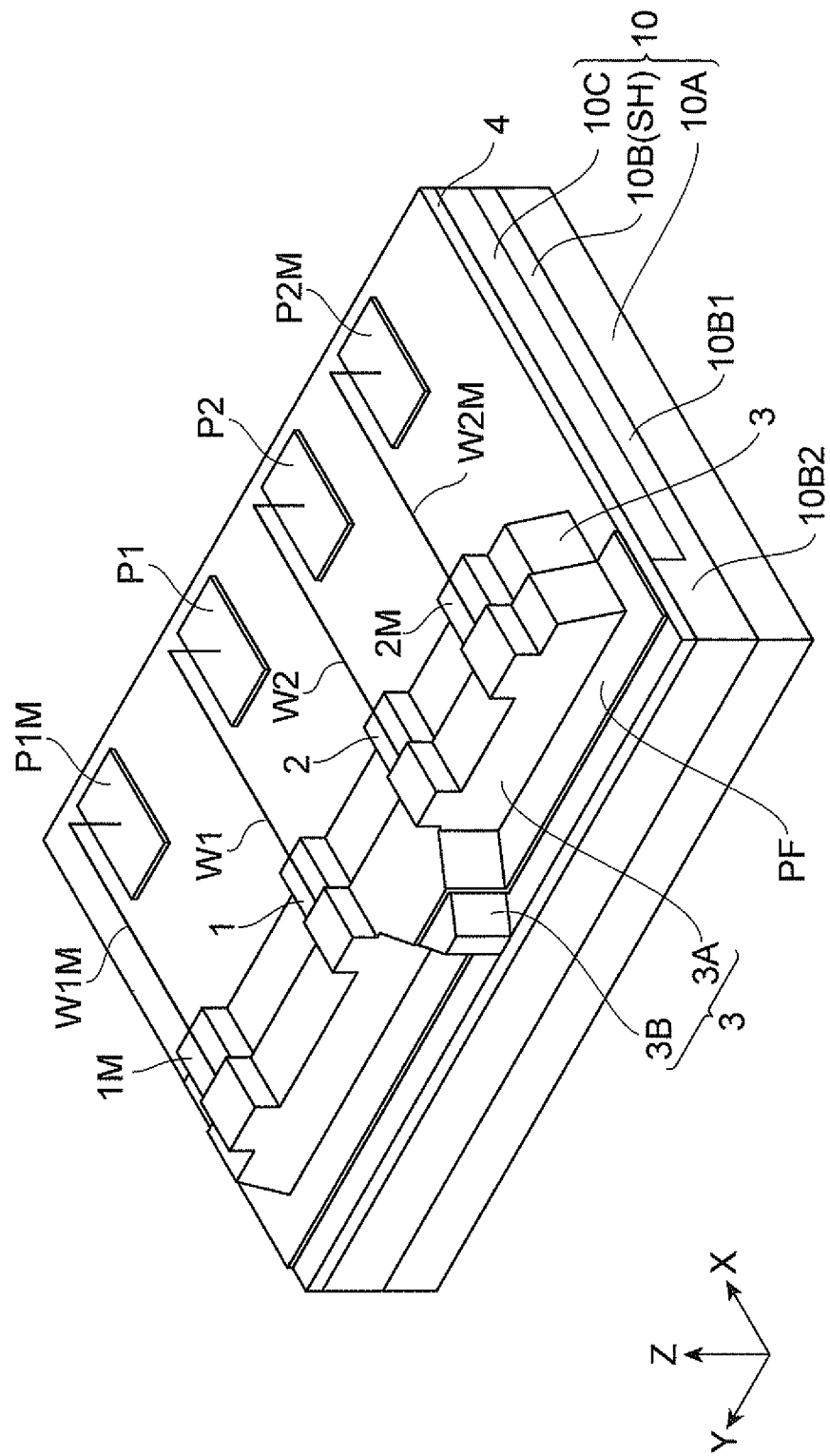
FIG. 20 is a perspective view of the spin transport device intermediate body illustrating the method of fabricating a spin transport device.

Next, an insulating film PF having a thickness of 20 nm is formed on surfaces at a side of a medium opposite surface of the ferromagnetic layers 1 and 2 and the electrodes 1M and 2M to cover the surfaces using a lift-off process, as shown in FIG. 20. This prevents the ferromagnetic layers 1 and 2 and the electrodes 1M and 2M from being brought into electrical contact with a lateral magnetic shield layer SH1 in a subsequent process. The insulating film PF is formed of, for example, $SiO_2$.

Figure 21:
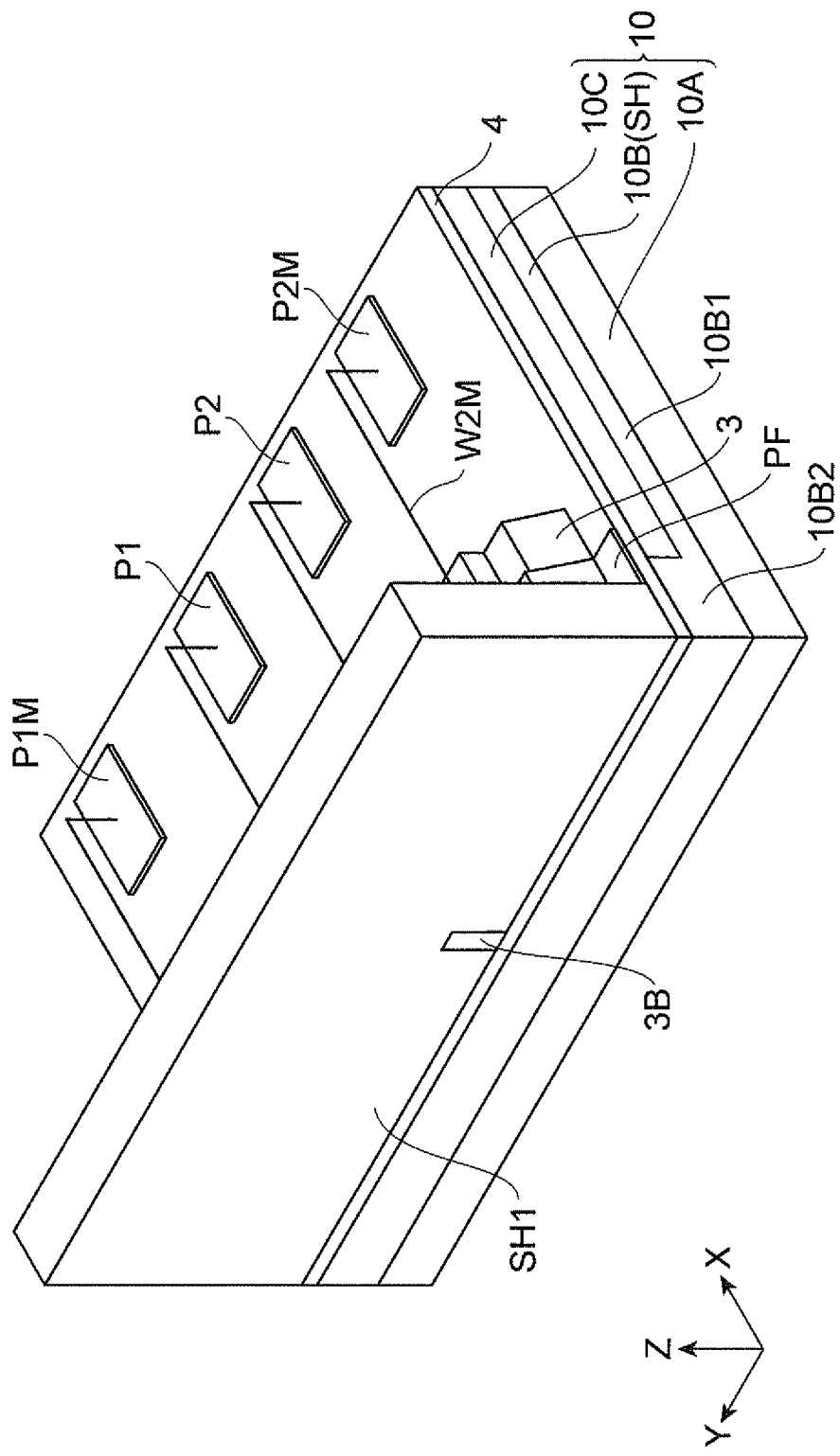
FIG. 21 is a perspective view of the spin transport device intermediate body illustrating the method of fabricating a spin transport device.

Next, a surface of the insulating film 4 at a side of the medium opposite surface other than the region in which the protrusion 3B is formed is covered with the lateral magnetic shield layer SH1 that extends along the Y axis, as shown in FIG. 21. The lateral magnetic shield layer SH1 is formed on the second magnetic shield 10B2 via the insulating film 4. In forming the lateral magnetic shield layer SH1, a mask pattern having an opening corresponding only to this formation region may be formed of a photoresist on the substrate surface, a soft magnetic material constituting the lateral magnetic shield may be deposited into the opening, and then the photoresist may be removed. A sputtering method may be used in order to deposit the soft magnetic material.

Figure 22:
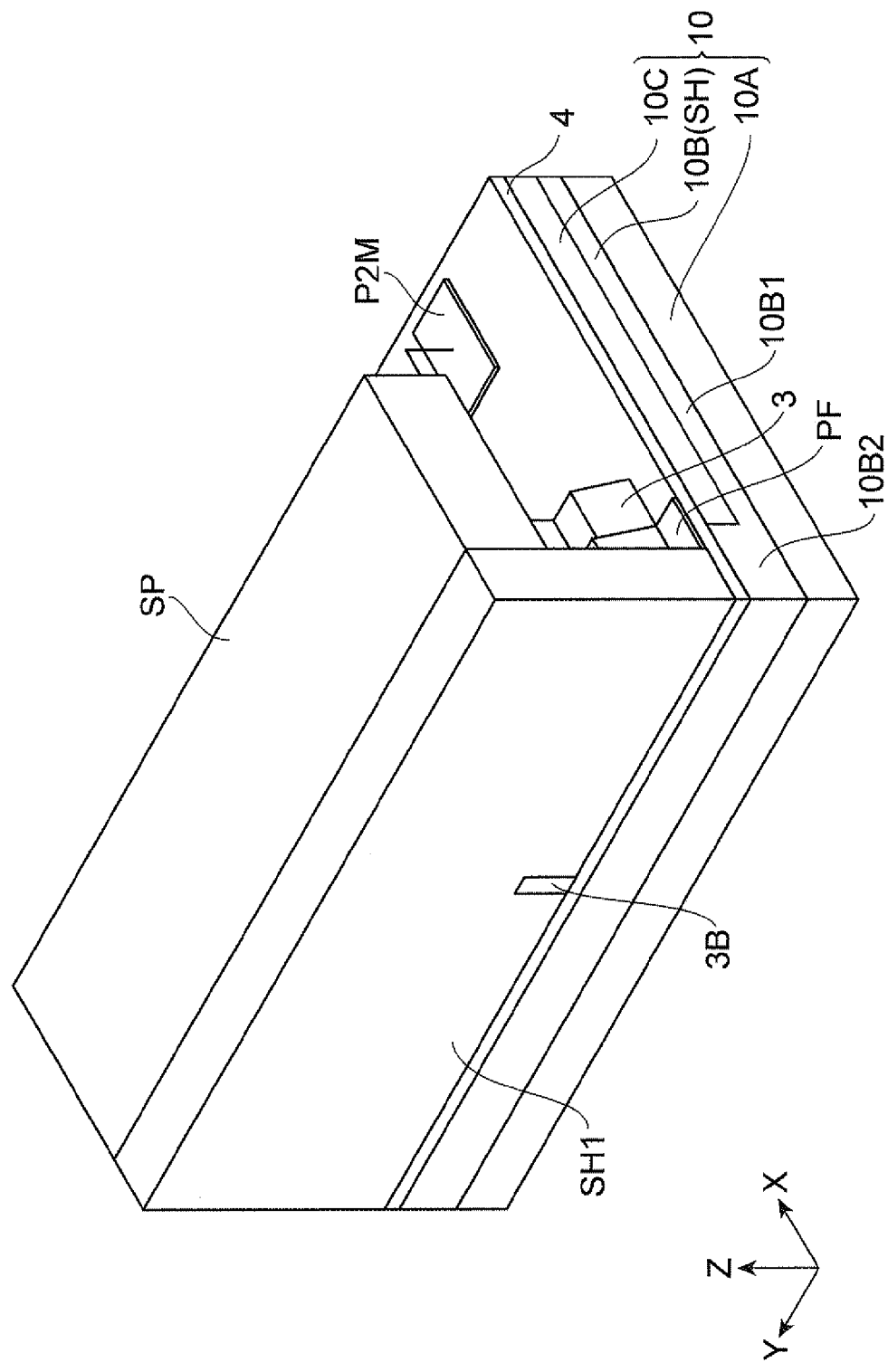
FIG. 22 is a perspective view of the spin transport device intermediate body illustrating the method of fabricating a spin transport device.

Next, an insulating film SP is formed as a spacer on the exposed substrate surface using a sputtering method to cover various wirings, as shown in FIG. 22, and an exposed surface of the insulating film SP is planarized through chemical mechanical polishing, if necessary. In this case, it is preferable that heights in the Z axis direction of the lateral magnetic shield SH1 and the insulating film SP be the same.

Next, an upper magnetic shield SH2 is formed on exposed surfaces, in a positive direction of the Z axis, of the lateral magnetic shield SH1 and the insulating film SP, as shown in FIG. 23. A sputtering method may be used for this formation. Through this process, a magnetic sensor is completed. Further, the respective magnetic shields 10B, SH1 and SH2 described above are magnetic shield layers and have a constant thickness.

Figure 24:
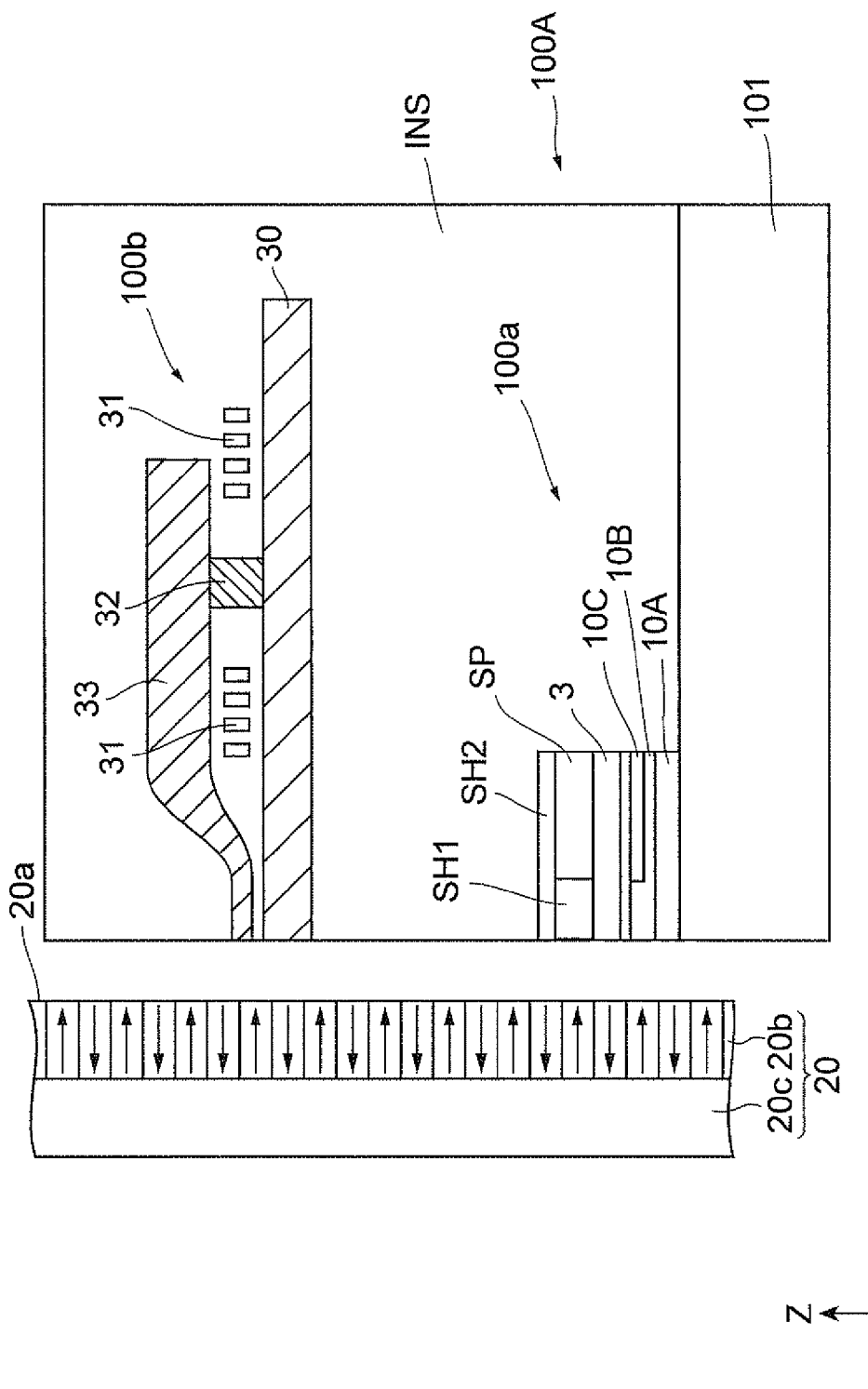
FIG. 24 is a view showing a magnetic head (magnetic sensor) using a spin transport device.

FIG. 24 is a longitudinal cross-section view of a magnetic head including a magnetic sensor.

A magnetic recording medium 20 includes a recording layer 20b having a recording surface 20a, and a soft magnetic under-layer 20c stacked on the recording layer 20b, and proceeds relatively with respect to a thin film magnetic recording/reproducing head 100A in a Z axis direction in FIG. 24. The thin film magnetic recording/reproducing head 100A includes a reading head unit 100a for reading a record from the magnetic recording medium 20, and a recording head unit 100b for performing recording on the magnetic recording medium 20. The reading head unit 100a and the recording head unit 100b are provided on a support substrate 101 and covered with a non-magnetic insulating layer INS such as alumina.

The magnetic sensor described above is incorporated in the magnetic head to constitute the reading head unit 100a. The magnetic sensor is formed as the reading head unit 100a on the support substrate 101, and the recording head unit 100b for writing is formed on the reading head unit 100a via the insulating layer INS. In the recording head unit 100b, a contact portion 32 and a main magnetic pole 33 are provided on a return yoke 30, which form a path for magnetic flux. A thin-film coil 31 is provided to surround the contact portion 32. If a recording current flows into the thin-film coil 31, magnetic flux is emitted from a tip of the main magnetic pole 33 such that information can be recorded on the recording layer 20b of the magnetic recording medium 20, such as a hard disk.

Further, the magnetization direction of the ferromagnetic layer may be any direction whether the non-local arrangement using only the spin current is used or the magnetoresistance effect is used, as described above. In the case of the former non-local arrangement, a difference in output result is not generated between when the magnetization direction is parallel and when the magnetization direction is antiparallel. However, since it is easy for the magnetization direction to be parallel by applying the magnetic field in the same direction to heat the ferromagnetic layer in a fabrication step, it is preferable that the magnetization directions of the first and second ferromagnetic layers be parallel. On the other hand, in the case of the latter arrangement using a magnetoresistance effect, it is preferable that the magnetization directions of the first and second ferromagnetic layers be antiparallel since a high output can be obtained compared to being parallel.

Further, the magnetization directions of the first ferromagnetic layer and the second ferromagnetic layer can be fixed by shape anisotropy (with a high aspect ratio) of the first ferromagnetic layer and the second ferromagnetic layer or by exchange-coupling an antiferromagnetic film and a ferromagnetic layer. Further, a spin relaxation time in the semiconductor layer 3 is equal to or more than 1 nsec.

While it is possible to improve a spin transport characteristic even in the case of a material other than Si when a single domain crystal layer is used as the spin transport channel, a semiconductor having, particularly, a cubic diamond structure of, for example, Si or a zincblende structure of, for example, GaAs is preferably used as the channel material since high-quality bulk crystal is widely fabricated and commercially available.

As described above, in the spin transport device described above, the spin is not uniformly diffused in the semiconductor layer 3, but the impurity concentration in the semiconductor is asymmetrically distributed. Thus, it is possible to suppress a shunt effect of the spin injected into the semiconductor layer 3 and, in principle, to obtain a maximum of twice the output.

Figure 25:
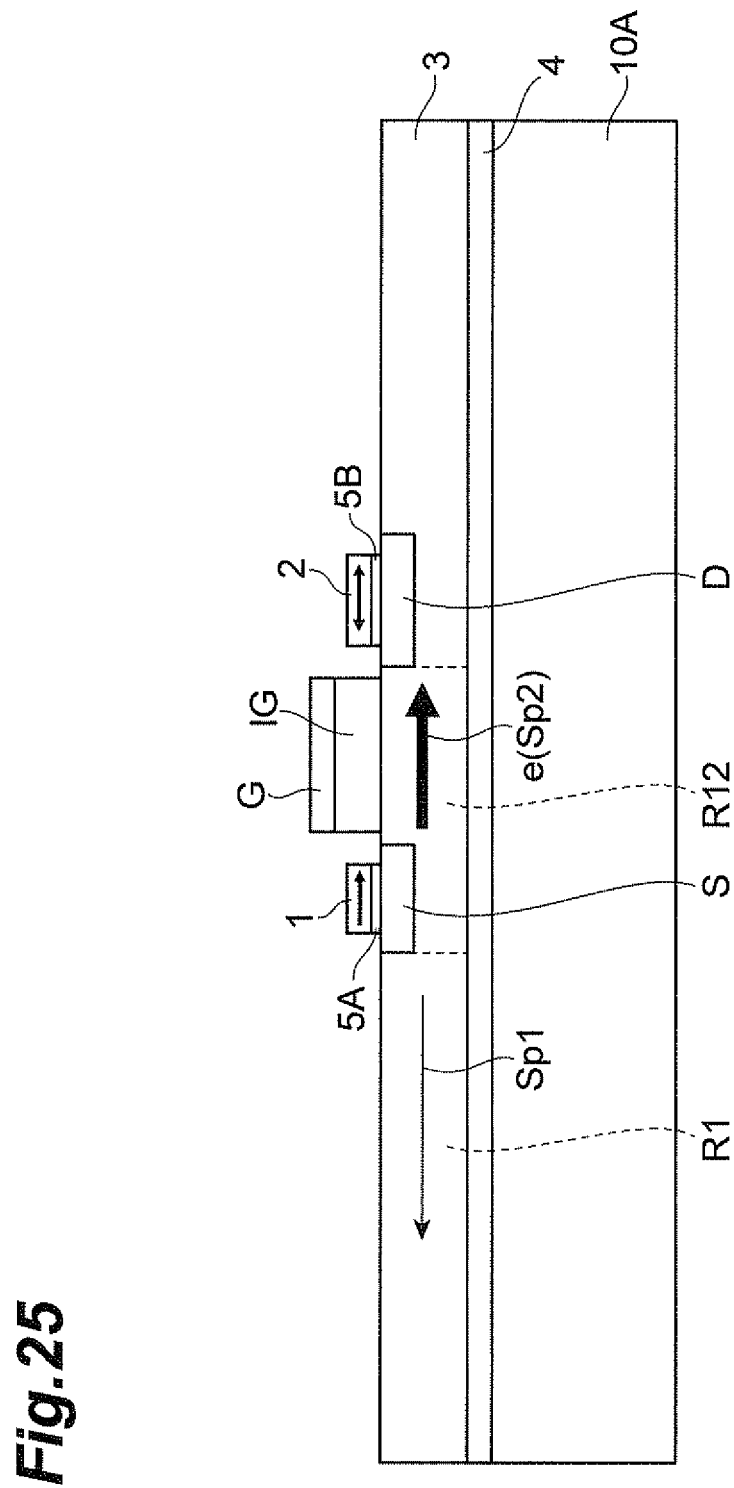
FIG. 25 is a view showing a spin transistor using a spin transport device.

FIG. 25 is a view showing a spin field effect transistor (FET) using a spin transport device.

This spin FET includes the same primary parts (a substrate 10A, an insulating layer 4, a semiconductor layer 3, first and second tunnel barrier layers 5A and 5B, and ferromagnetic layers 1 and 2) as the spin transport device shown in FIGS. 1 to 8. Here, the semiconductor layer 3 is set to be of a P type, and a source region S and a drain region D are formed by adding N type impurities to the semiconductor layer 3. The tunnel barrier layers 5A and 5B described above are formed on the source region S and the drain region D of the semiconductor layer 3, respectively, and the ferromagnetic layers 1 and 2 are formed on the tunnel barrier layers 5A and 5B, respectively. In order to control a potential of the semiconductor layer 3 between the first and second ferromagnetic layers 1 and 2, a gate electrode G is formed on a region between the first and second ferromagnetic layers 1 and 2 via a gate insulating film IG.

An amount of spin-polarized electron flow e from the source S to the drain D can be controlled by a gate voltage. However, in this case, N type impurities are added to the second region R12 between the first ferromagnetic layer 1 and the second ferromagnetic layer 2 to increase the spin current Sp2. Impurities are intentionally not added to the second region R1 opposite to the second region R12. Further, the second ferromagnetic layer 2 is a free layer. A magnetization direction of the free layer can be controlled by an external magnetic field or spin injection structure, which is not shown. An amount of electrons flowing into the free layer can be controlled by controlling the magnetization direction of the free layer.

This transistor functions as a normally-on type transistor since low concentration impurities are added immediately below the gate, but the amount of electrons can be adjusted by applying a gate voltage. Further, the spin transport device described above may be applied to memories or logic circuits, as well as magnetic sensors and spin transistors.

Further, in the first and second ferromagnetic layers 1 and 2, it is possible to obtain different reversed magnetic fields using a difference between aspect ratios in the X direction and the Y direction.

What is claimed is:

1. A spin transport device comprising:
    a semiconductor layer;
    a first ferromagnetic layer provided on the semiconductor layer via a first tunnel barrier layer; and
    a second ferromagnetic layer provided on the semiconductor layer via a second tunnel barrier layer to be spaced from the first ferromagnetic layer,
    wherein the semiconductor layer comprises:
        a first region extending in a direction away from the first ferromagnetic layer and the second ferromagnetic layer, the first region extending from the first ferromagnetic layer along a direction orthogonal to a thickness direction of the first ferromagnetic layer; and
        a second region extending in a direction from the first ferromagnetic layer toward the second ferromagnetic layer, the second region extending along the direction orthogonal to the thickness direction of the first ferromagnetic layer, an entirety of the second region having a relatively higher impurity concentration than an impurity concentration in the first region, the second region including a region between a region immediately below the first ferromagnetic layer and a region immediately below the second ferromagnetic layer in the semiconductor layer.

2. The spin transport device according to claim 1, wherein:
    the second region includes regions in the semiconductor layer immediately below the first and second ferromagnetic layers.

3. The spin transport device according to claim 1, comprising:
    a first reference electrode provided in a region outside a region between the first and second ferromagnetic layers on the semiconductor layer;
    a second reference electrode provided in the outside region on the semiconductor layer;
    an electron flow source connected between the first ferromagnetic layer and the first reference electrode; and
    a voltage detection circuit connected between the second ferromagnetic layer and the second reference electrode,
    wherein the first region is located between the first ferromagnetic layer and the first reference electrode.

4. The spin transport device according to claim 1, wherein:
    the impurity concentration in the first region is $1 \times 10^{13}/cm^3$ to less than $1 \times 10^{18}/cm^3$, and
    the impurity concentration in the second region is $1 \times 10^{18}/cm^3$ to $1 \times 10^{20}/cm^3$.

5. The spin transport device according to claim 1, wherein:
    each of the first and second tunnel barrier layers is formed of MgO, $Al_2O_3$, $SiO_2$, ZnO, or $MgAl_2O_4$.

* * * * *